United States Patent [19]
Miyatake

[11] Patent Number: 5,074,667
[45] Date of Patent: Dec. 24, 1991

[54] POSITION DETECTOR EMPLOYING A SECTOR FRESNEL ZONE PLATE

[75] Inventor: Tsutomu Miyatake, Nihama, Japan
[73] Assignee: Sumitomo Heavy Industries Co. Ltd., Japan
[21] Appl. No.: 389,541
[22] Filed: Aug. 4, 1989
[30] Foreign Application Priority Data Aug. 15, 1988 [JP] Japan .............................. 63-202857
May 18, 1989 [JP] Japan .............................. 1-125267

[51] Int. Cl.⁵ ............................................ G01B 11/00
[52] U.S. Cl. ................................. 356/401; 250/491.1; 378/34
[58] Field of Search ..................... 356/399, 400, 401; 250/491.1, 548; 378/34, 35

[56] References Cited

U.S. PATENT DOCUMENTS

| | | | |
|---|---|---|---|
| 4,326,805 | 4/1982 | Feldman et al. | 356/401 |
| 4,600,309 | 7/1986 | Fay | 356/401 |
| 4,815,854 | 3/1989 | Tanaka et al. | 356/401 |
| 4,918,301 | 4/1990 | Miyatake | 250/216 |

FOREIGN PATENT DOCUMENTS

| | | | |
|---|---|---|---|
| 179438 | 4/1986 | European Pat. Off. | 378/34 |
| 44-23794 | 10/1969 | Japan . | |
| 63-162915 | 6/1988 | Japan . | |

Primary Examiner—F. L. Evans
Attorney, Agent, or Firm—Ostrolenk, Faber, Gerb & Soffen

[57] ABSTRACT

A position detector for use with an X ray exposure apparatus and the like includes sector Fresnel zone plates (SFZP) which are provided on a mask and a wafer minutely spaced in position in the direction of the optical axis of an exposure X ray, as alignment marks. A laser ray of at least one of wavelength is applied to the surfaces of the SFZPs at an angle with respect to the surfaces. The SFZPs are designed such that the principal focal planes of Fesnel diffraction images of the SFZPs to a single wavelenth laser ray agree with each other. In the case of illumination rays of a plurality of wavelengths, an objective lens is provided in a detection optical system which objective has such an axial chromatic aberration that focal planes of the objective lens to the plural wavelength rays agree with respective Fresnel diffraction focal planes of the SFZPs to the rays. The image formed on the superposed focal plane of the objective lens is converted into an electric signal, which is handled to detect a relative position between the mask and wafer in the direction perpendicular to the surface thereof.

25 Claims, 25 Drawing Sheets

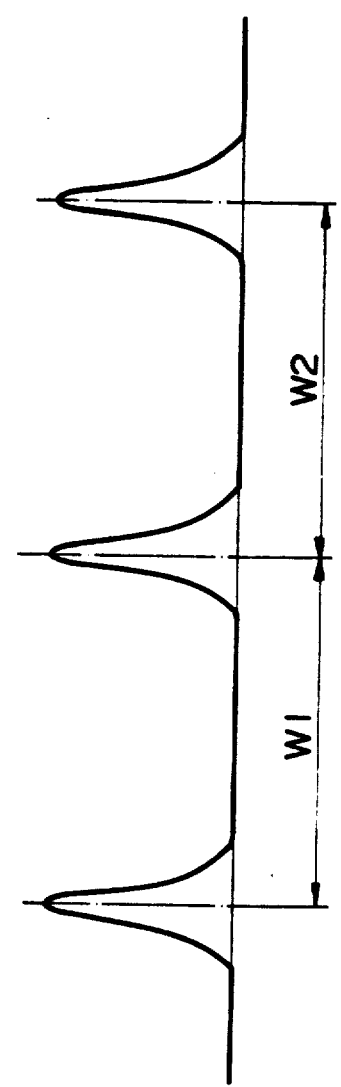
FIG. 29A Output signal
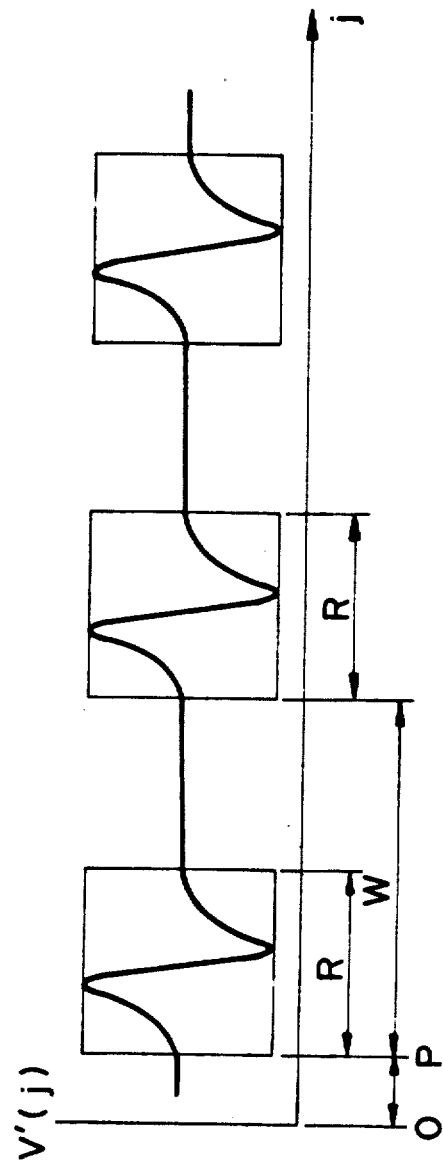
FIG. 29B 1st order differentiated value Wafer mark signal    Wafer mark signal Mask mark signal 680 mV Wafer mark signal    Wafer mark signal Mask mark signal

POSITION DETECTOR EMPLOYING A SECTOR FRESNEL ZONE PLATE

BACKGROUND OF THE INVENTION

The present invention relates to a super precise position detector, and more particularly, to a position detector for detecting a relative position between a mask and a wafer in a stepper X ray exposure apparatus in the order of 0.01 $\mu$m by employing sector Fresnel zone plates.

In general, in a stepper X ray exposure apparatus, X ray microanalyzer and the like, it is impossible to set up an optical microscope right over an object to be analyzed, processed or worked in an ordinary manner so as to observe a desired point on the object, since the area right over the object is in the passage of X rays, electroncurrent and the like. For this reason, an area to be observed is observed obliquely with an ordinary optical microscope. At this time, due to the depth of a focus, the area coming into the field of vision is extremely limited. In addition, when a lens group is disposed in parallel with the surface of an area to be observed to obliquely observe an object to be observed, an image is formed by an oblique ray, resulting in that aberration increases and an image to be observed becomes indistinct.

With regard to a stepper X ray exposure apparatus of the above-mentioned arrangement, I have proposed a novel position detector in Japanese Parent Application No. Sho 63-162915 bearing the title "a position detector employing double linear Fresnel zone plates under illumination of multiple wavelength light". This position detector is to detect a relative position between a mask and a wafer which are spaced at a minute distance from each other in the direction of the optical axis of exposure X ray, in the direction perpendicular to the optical axis.

In this position detector, a mask and a wafer are respectively provided with a linear Fresnel zone plate (hereinafter referred to as LFZP) on which alignment marks are formed. The LFZPs are simultaneously illuminated by light rays of a plurality of wavelengths in the same direction from the upper in slant. An objective lens is disposed at an angle with the surface of the LFZPs on the opposite side with respect to the normal of LFZP. The lens has such an axial chromatic aberration that focal planes of the lens to light rays of a plurality of wavelengths agree with principal focal planes of the LFZPs by Fresnel diffraction to the plural wavelength rays which planes are different in position with each of the light rays, respectively. The Fresnel diffraction images on the principal focal planes of the LFZPs which planes are different in position to each of the plural wavelength rays incident upon the LFZP, are respectively focused through the objective lens on the same image forming planes of the objective lens in superposing relationship into a straight line. The Fresnel diffraction image in a straight line is converted into an electric signal by a linear sensor disposed on the image forming plane by a linear scanning operation in the direction perpendicular to the longitudinal direction of the image. A cylindrical lens is disposed between the objective lens and the linear sensor such that the Fresnel diffraction image in a straight line is compressed in the longitudinal direction thereof and is formed on the linear sensor. Then, a signal thus obtained by the linear sensor is handled to detect a relative position between the alignment marks on the LFZPs.

The principal focal plane (62) of the LFZP, however, as shown in FIG. 1, is parallel to the surface of LFZP, so that the principal focal planes of the alignment marks are parallel to the surface of the mask and wafer.

With such arrangement, to make a positional alignment servo operation possible during X ray exposure, it is necessary to enlarge a detection angle of a detection optical system disposed downstream of the objective lens with respect to the normal of the wafer (mask) plane. A large detection angle, however, deviates largely from an angle of 90° between the optical axis of the detection optical system and the focal planes of the alignment marks to reduce the image forming area of the detection optical system with the result increasing distortion of an image due to an oblique image formation. As a result, it is very difficult to satisfactorily detect a light intensity of Fresnel diffraction image by the linear sensor with a good linearity and accuracy. As a solution to this disadvantage, it is conceivable to apply the improvement of a detection optical system proposed in Japanese Patent Publication No. Sho 44-23794, for example. The proposal has the following structure. In a detection optical system which observes an object surface from the upper right thereof, in order to form a real image perpendicular to the optical axis of an eyepiece on the optical axis, an objective lens is inclined with respect to the observing surface of the object and the eyepiece. Alternatively, a detection optical system is constructed so as to interpose a parallel ray portion within part of the optical path of the detection optical system. However, this system has the following disadvantages.

① Design and manufacture of the optical system are cumbersome.
② Optical performance deteriorates.
③ The resolving power falls due to decrease in optical performance.
④ The detection angle of the optical system with respect to the surface of an object is limited.

Consequently, it is not preferred even if the above proposal is applied to the foregoing position detector employing double linear Fresnel zone plates.

SUMMARY OF THE INVENTION

It is an object of the present invention to the above disadvantages by providing a position detector which is capable of detecting a relative position in the order of 0.01 $\mu$m between a mask and a wafer in an X ray aligner including a light source such as SOR (synchrotron orbit radiation) light for use in the production of memory elements such as 16M, 64M, and 256M, to be mass produced in the future at a high rate in the extremely high integration of semiconductors. An alignment system for use in a light stepper and an X ray aligner are classified into the following two methods.

① Pattern measuring method (contrast method, edge detection method),
② Method utilizing a diffracted light ray. These methods each have their advantages and disadvantages and there is little reason to choose between them. The present invention, however, provides a position detector employing a hybrid alignment system combining the advantages of the above ① and ②.

A position detector of the present invention is used to detect a relative position between first and second object bodies minutely spaced in position in the direction of the optical axis of an exposure X ray, in the direction perpendicular to the X ray optical axis. First and second sector Fresnel zone plates (hereinafter referred as SFZP) on which alignment marks are formed are provided respectively on the first and second object bodies. An illumination system is arranged to simultaneously illuminate these SFZPs from the same direction with light of a plurality of wavelengths. The first and second SFZPs on the first and second object bodies are constructed such that respective Fresnel diffraction principal focal planes thereof to light of the plurality of wavelengths, which planes are different in position with each of the plural wavelength light, agree with each other for at least one of the plurality of wavelengths. An objective lens having such an axial chromatic aberration that principal focal planes of the objective lens to light of the plurality of wavelengths agree with respective diffraction principal focal planes, which are different in position, of the second SFZP on the second object body to light of the plurality of wavelengths, is provided in the optical path of the position detecting system. A Fresnel diffraction image is formed in the shape of a straight line through the objective lens on the image forming plane which is superposingly formed by the objective lens. The Fresnel diffraction image is linearly scanned in the direction perpendicular to the longitudinal direction of the Fresnel diffraction image to convert it into an electric signal by a linear sensor disposed on the image forming plane. A cylindrical lens is disposed between the objective lens and the linear sensor such that the Fresnel diffraction image in a straight line is compressed in the longitudinal direction thereof and is formed on the linear sensor. The signal obtained by the linear sensor is handled to detect a position of the alignment mark. Thus, the position detector is of a structure employing sector Fresnel zone plates under illumination of multiple wavelength light.

It is preferred that a single SFZP is employed for the first alignment mark of the first object body and a pair of SFZPs are employed for the second alignment mark of the second object body, the first single SFZP being interposed between the pair of the second SFZPs. Alternatively, a single second SFZP may be interposed between a pair of second SFZPs or first and second SFZP may be both single.

In practice, the first object body is a mask and the second object body a wafer, and a transparent window zone is provided in a mask area where light incident upon and diffracted by the alignment mark of the wafer passes through.

The illumination optical system and the objective lens are respectively disposed at an angle with respect to the surface of the first and second alignment marks on the opposite sides of the optical axis of the exposure X ray. When the illumination optical system is arranged such that its illmination angle is equal to a detection angle of the detection optical system including the objective lens with respect to the surface of the first and second alignment marks, it is possible to dispose the position detector of the present invention outside the X ray exposure zone.

In addition, it is possible to detect a relative position with a high accuracy when a signal obtained by the linear sensor is handled in a signal handling apparatus by a similar pattern matching method.

With the foregoing arrangement, when the SFZPs provided on the mask and the wafer are illuminated by multiple wavelength light, principal focal planes of the allignment marks are formed by diffraction at different positions according to wavelengths of the multiple wavelength light. The focal lengths of each SFZP on the mask and the wafer is selected such that principal focal planes of the first and second SFZPs are superposed on the same focal plane, with respect to a ray of at least one of the multiple wavelengths. The objective lens is selected to have such an axial chromatic aberration that focal planes of the objective lens to the multiple wavelength light agree with the diffration principal focal planes of the SFZP on the wafer to the multiple wavelength light, respectively. As a result, Fresnel diffraction images of the SFZPs on the principal focal planes to the multiple wavelengths rays are superposingly focused through the objective lens on the same image forming plane thereof. The Fresnel diffraction image of the SFZPs thus superposed on the same image forming plane is in a straight line. The image is linearly scanned by a linear sensor disposed on the image forming plane in the direction perpendicular to the longitudinal direction of the image to be converted into an electric signal. At this time, the Fresnel diffraction image is longitudinally compressed by a cylindrical lens disposed between the objective lens and the linear sensor and is formed on the linear sensor. A signal obtained by the linear sensor is handled and a relative position between the alignment marks is thus detected.

Since the SFZPs provided with alignment marks are employed in the position detector, the principal focal plane of the SFZP is normal to the optical axis of the objective lens, so that even when the detection optical system is tilted, it is possible to form a Fresnel diffraction image on a linear sensor with an excellent performance in the same manner in general image formation without involving problems in optical image formation such as image blurring, limited image formation and inclined image formation due to an oblique image formation.

While the foregoing refers to a position detector employing the SFZP above mentioned, multiple-color light source and double focus detection method utilizing chromatic aberration, as the result of an experiment with the position detector, it is confirmed that the resolution for detection of 0.01 μm and less can be fully attained even with illumination of a single color ray of wavelength 633 nm.

At first, it has been considered that a multiplecolor light source and chromatic aberration double focus apparatus are absolutely required in the position detector above mentioned in order to reduce dependence upon process (chiefly multiplex interference in a resist film). As a result of experiments, however, it is found that a magnifying detection optical system employing a combination of ordinary objective lens and relay lens as a detection system with a He-Ne laser (wavelength 633 nm) as a single color illumination light source can be fully met, which will be described later.

Consequently, a position detector employing SFZPs can be constructed with a very simple optical system, resulting in reduction of cost and miniaturization.

This position detector employing a single color illumination light source is used to detect a relative position between first and second object bodies minutely spaced in the direction of the optical axis of an exposure X ray in the direction perpendicular to the optical axis. First and second SFZPs on which alignment marks are formed are respectively provided on first and second object bodies. An illumination optical system is arranged which simultaneously illuminates the first and second SFZPs with light of a single wavelength from the same direction. The first and second SFZPs are constructed such that principal focal planes of Fresnel diffraction images by the SFZPs on first and second object bodies, which planes are different in position with the single illumation light, agree with each other on the same plane. An objective lens is provided which has such a chromatic aberration that its focal plane agree with the superposed principal focal plane. A Fresnel diffraction image of the SFZPs formed on the same image forming plane through the objective lens is in a straight line. A linear sensor is disposed on the image forming plane such that a Fresnel diffraction image of the SFZPs, which is in a straight line, on the image forming plane through the objective lens is linearly scanned in the direction perpendicular to the longitudinal direction of the image and is converted into an electric signal. A signal obtained by the linear sensor is handled to detect a relative position of the alignment marks.

It is preferred that a single SFZP or a pair of SFZPs are employed respectively for alignment marks on the first and second object body, a single SFZP on the first object body being interposed between a pair of the SFZPs on the second object body, or a singl SFZP on the second object body being interposed between a pair of the SFZPs on the first object body, or both a single SFZP on first and second object bodies being appropriately arranged with respect to each other.

The first object body is a mask and the second object body is a wafer. A transparent window zone is provided in a mark area where light incident upon and diffracted by the alignment marks of the wafer passes through.

The illumination optical system and the objective lens are respectively disposed at an angle with respect to the normal of the surface of the SFZP and on the opposite side of the normal. The illumination optical system is arranged such that its illumination angle is equal to a detection angle of a detection optical system including the objective lens, with respect to the surface of the SFZP. Then, it is possible to locate the position detector of the present invention in an X ray exposure apparatus outside the X ray exposure zone.

In addition, it is possible to detect positions of the alignment marks with a high accuracy by handling a signal obtained by the linear sensor by means of a similar pattern matching operation.

With the arrangement above mentioned, when the first and second SFZPs mounted on first and second object bodies are illuminated by a ray of a single wavelength. Fresnel diffraction images by the SFZPs are formed at respective principal focal planes. Principal focal lengths of the SFZPs are selected such that principal focal planes of Fresnel diffraction images of the SFZPs lie on the same focal plane. A difference between the principal focal lengths of the first and second SFZPs on first and second object bodies is about 40 μm. An objective lens is disposed in a detection system such that a focal plane of the objective lens lies on the same focal plane formed by the SFZPs. Thus, the Fresnel diffraction images of the alignment marks or first and second object bodies are formed on the same image forming plane in a straight line. The Fresnel diffraction image thus formed is linearly scanned in the direction perpendicular to the longitudinal direction of the image and is converted into an electric signal by a linear sensor disposed on the image forming plane. A signal obtained by the lenear sensor is handled to detect a relative position between the alignment marks.

Since the SFZPs are employed for the alignment marks the principal focal planes of Fresnel diffraction images by first and second bodies, which are on the same plane, are perpendicular to the optical axis of the objective lens even when the detection optical system is tilted, so that is is possible to form a Fresnel diffraction image on a linear sensor with an excellent performance in the same manner in general image formation without involving problems in optical image formation such as image blurring, limited image formation and inclined image formation due to an oblique image formation.

The position detector of the present invention has the following advantages.

(1) Is is possible to make an oblique detection with an extremely simple optical system without interfering with an exposure X ray.

(2) Since an oblique detection angle is determined by the design of an SFZP, a resolving power of the objective lens can be increased independently of the detection angle, so that a highly accurate detection is possible.

(3) A servo control is enabled during an X ray exposure operation to detect alignment marks provided within the X ray exposure area.

(4) Dependence upon process is extremely reduced.
  ① Dependence upon symmetry of the marks is extremely reduced.
  ② There is little influence of standing wave effects due to interference of light as by a thin film.

(3) There is no effect of variation in a gap between an X ray mask and a wafer and dependence upon the gap is extremely reduced.

(6) High speed detection is possible.

(7) The size of marks is reduced.

According to the present invention, it is possible to perform a superfine position measurement (the order of 0.01 μm), and more particularly, to detect a distance between a mask and a wafer with the order of 0.01 μm. In addition, it is possible to carry out a high speed throughput operation.

Furthermore, a position detector according to the present invention has the following noticeable effects.

(1) It is possible to perform a detection by largely inclining an objective lens of the detection optical system.

(2) It is possible to incline the detection optical system so as to be outside the X ray exposure zone.

(3) It is possible to detect the alignment marks during an X ray exposure operation.

(4) It is possible to use the alignment marks within the X ray exposure zone.

(5) In order to raise an optical resolving power of an objective lens of the detection optical system, the numerical aperture of the objective lens should be increased. On the other hand, the objective lens can be largely and simply inclined by employing SFZPs without interfering in the X ray exposure zone. Consquently, it is possible to set a limit of the numerical aperture which can be set with an oblique angle, to an very high value.

(6) Since it ts possible to detect the alignment mark, which is provided within the X ray exposure zone, even during the exposure operation without interfering with the exposure X ray, a position of a mask/a wafer can be detected and corrected without evacuating the detection optical system during the X ray exposure operation. Since it is possible to effect a step repeating exposure on the whole surface of a wafer, an accuracy of alignment and a throughput operation can be remarkably improved.

(7) Although the shape of alignment marks becomes somewhat complicated as compared with a linear Fresnel zone plate because a factor of angle is added to the alignment marks, the shape is much simpler than a circular Fresnel zone, so that a pattern change due to a process change seldom occurs.

(8) Since the oblique incidence angle is determined by a SFZP and the detection optical system does not involve a special technique in design regarding the oblique incidence and difficulties in manufacturing, the design and manufacturing are simplified and hence a cost is reduced.

(9) Both the illumination and detection systems can be constructed with a simple optical system.

(10) The scope of detection is much wider than that of a diffraction light system.

(11) In the detection optical system,
  ① There is no moving part for swinging an incident ray, so that the structure is simple.
  ② Since an image is in a straight line and hence a linear sensor of the high speed type is easily employed, high speed detection can be easily conducted. When an image is a circular spot, two-dimensional detection is required with a two-dimensioned camera, with which it is impossible to conduct a high speed scanning.

(12) A detection accuracy is influenced by the nature of an image spot with a Fresnel zone plate as follows.
  ① Patterning in an SFZP is easier than that in a circular Fresnel zone plate, so that a good image spot can be easily obtained.
  ② A position detector employing a circular Fresnel zone plate or a linear Fresnel zone plate requires a vertical incidence of rays. In this case, there is a problem of interference between image spots produced by reflection on the surface of a mask and passing through a slit of a zone plate on a mask after reflected on the surface of a wafer. Consequently, light intensity of an image spot varies with a gap between the mask and wafer and detection accuracy is reduced.

In contrast, an oblique incidence is utilized in a position detector employing SFZPs, so that it is possible to completely shut out a spot produced by a ray passing through a mask by providing a window zone and a shielding zone, for example. There is no effect of variation in a gap between a mask and a wafer, resulting in a stable and accurate detection.
  ③ A main reason for reduction of accuracy in a spot produced by a circular Fresnel zone plate is based on what is known in a lens as astigmatism what is called in a lens. This greatly depends upon a pattern accuracy, perpendicularity of an incident ray with respect to a circular Fresnel zone plate, and a detection angle, to which astigmatism of a spot is extremely sensitive. An offset error in a detection accuracy would be seriously affected by the astigmatism.

In contrast, in the case of SFZPs, perpendicularity of an incident ray and a detection angle do not cause astigmatism in principle. In addition, the effect of astigmatism due to accuracy in pattern exposure can be largely reduced by a raster compression by utilizing linearity of an image spot.

BRIEF DESCRIPTION OF THE DRAWINGS

FIGS. 29A and 29B are diagrams for explaining a similar pattern matching method.

DETAILED DESCRIPTION OF PREFERRED EMBODIMENTS

The structure and operation of a first embodiment of a position detector according to the present invention will be described hereinafter with reference to FIG. 2 to FIG. 20.

Figure 1:
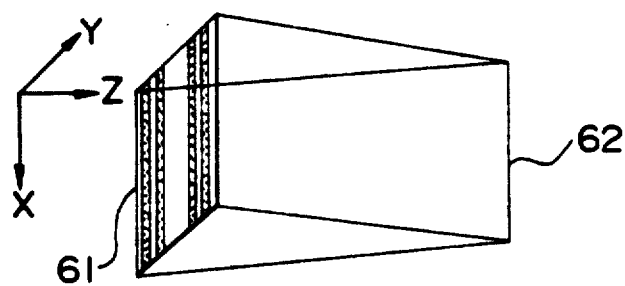
FIG. 1 is an explanatory diagram of a Fresnel diffraction focus by a conventional linear Fresnel zone plate.
Figure 2:
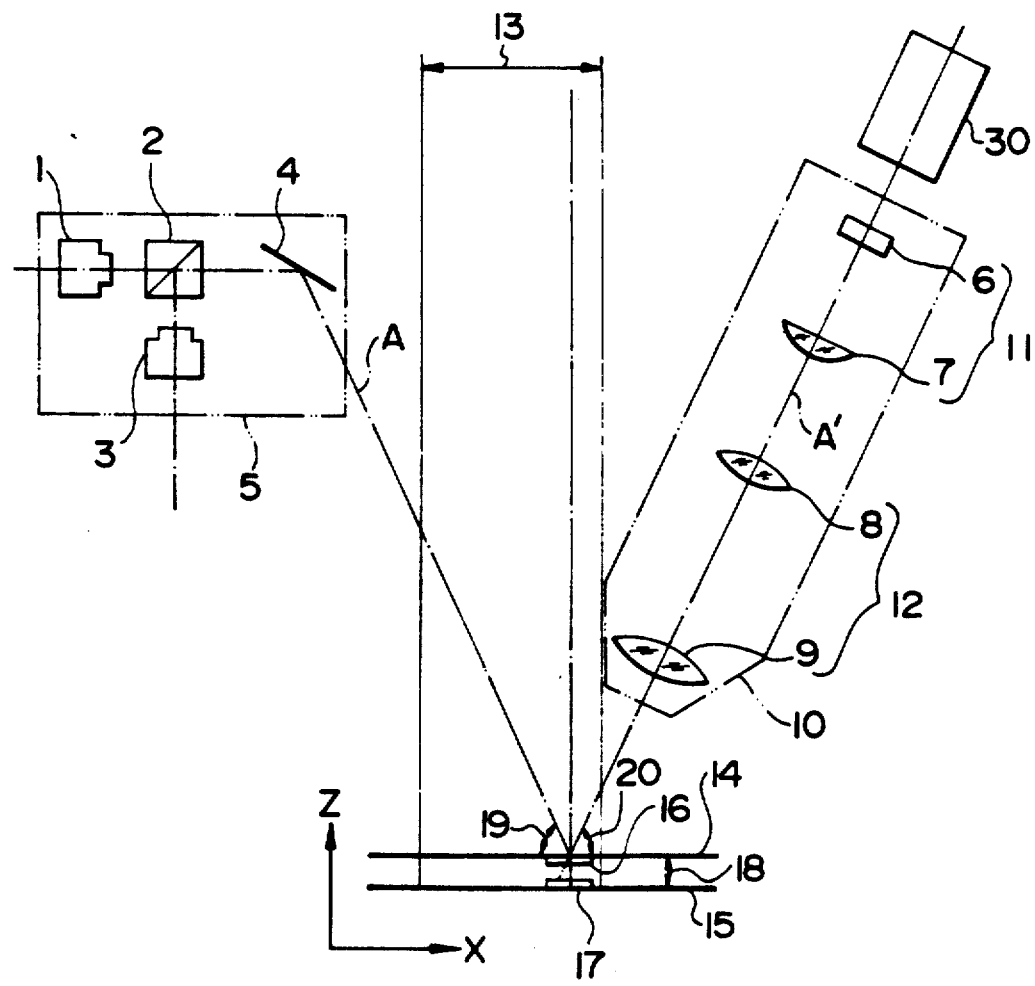
FIG. 2 is a schematic front view of a first embodiment of a position detector according to the present invention.
Figure 3:
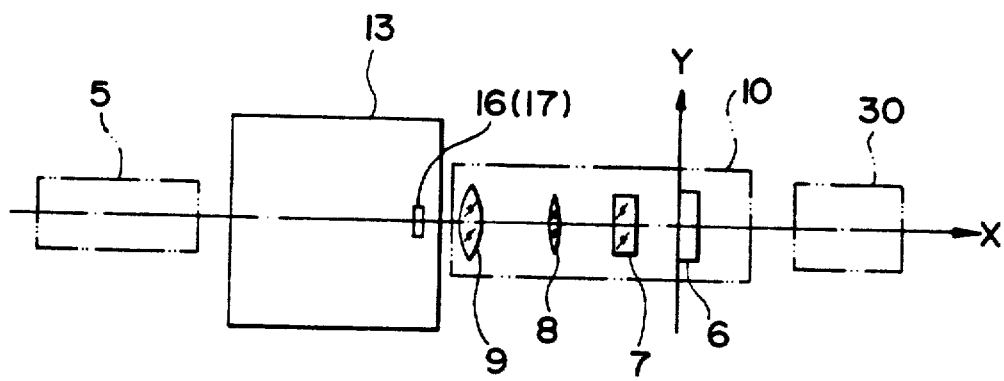
FIG. 3 is a schematic plan view of the position detector shown in FIG. 2.

FIG. 2 is schematic front view of a position detector which is applied to a mask and a wafer in a stepper X ray exposure apparatus. FIG. 3 is a schematic plan view of the position detector. A mask 14 is disposed upon a wafer 15 with a gap 18 of several ten $\mu$m between them. An illumination optical system 5 and a detection optical system 10 are respectively arranged at the upper right and left of the surface of the mask and wafer in opposing relationship with respect to the normal of the surface.

An angle of the optical axis A of obliquely incident illumination light of the illumination optical system 5 with respect to the mask (wafer) surface is equal to an oblique detection angle of the optical axis A' of the detection optical system 10 with respect to the mask surface, which angle is normally in a range of 45° through 80° (65° in FIG. 2). An aligment mark 16 is provided on the mask 14 and an alignment mark 17 is provided on the wafer 15. The inclinations of the illumination and detection light rays make it possible to detect the alignment marks located within an X ray exposure area 13 which is perpendicular to the mask surface, without shifting the illumination and detection optical systems 5, 10. Since the detection optical system 10 is located outside the optical path of the exposure X ray, it is possible to simultaneously detect both the alignment marks 16,17 during X ray exposure operation without shifting the illumination and detection optical systems 5, 10, with the result that a high speed throughput operation is made possible.

Although the illumination optical system 5 shown in FIG. 2 employs a laser ray, any other illumination ray having a bright line with a reduced half width and coherency may be used. In FIG. 2, a laser ray of wavelength $\lambda_2$, from a laser source 1 and a laser ray of wavelength $\lambda_2$ from a laser source 3 ($\lambda_1 < \lambda_2$) are combined through a beam splitter 2 and reflected by a mirror 4 downward into a parallel ray to illuminate the alignment marks 16, 17. The detection optical system 10 includes an objective lens 9 having an axial chromatic aberration on the optical axis thereof. Since the objective lens 9 has different focal lengths to rays of wavelengths $\lambda_1$ and $\lambda_2$, it is possible to select the objective lens 9 so as to form an image at the same image position thereof by superposing images of bodies which are located at different positions to the rays of wavelengths $\lambda_1$ and $\lambda_2$ (which will be described later). Namely, principal focal planes of Fresnel diffraction images produced by the alignment marks 16, 17 to the rays of $\lambda_1$ and $\lambda_2$, which planes are at different positions, are allowed to agree with focal planes of the objective lens 9 to the rays of $\lambda_1$ and $\lambda_2$, respectively.

With such arrangement, when the rays of $\lambda_1$ and $\lambda_2$ pass through the objective lens 9 and a relay lens 8, as shown in FIG. 3, an image is superposingly formed on a linear sensor 6 having a detection zone which is enlongated in a direction Y. The relay lens 8 is not necessarily requred.

A cylindrical lens 7 is disposed on the XZ plane shown in FIG. 2 between the relay lens 8 and the linear sensor 6. The cylindrical lens 7 serves to form an image on the linear sensor 6 by linearly compressing foci of the alignment marks 16, 17 which foci are in a straight line perpendicular to the optical axis A' of the detection optical system 10, in the direction of the line, so that a high and reliable detection is enabled.

A signal detected by the linear sensor 6 is handled as will be described later to detect positions of the alignments marks 16, 17 in the direction Y.

Details of the structural elements mentioned above are now described hereinafter.

Figure 4:
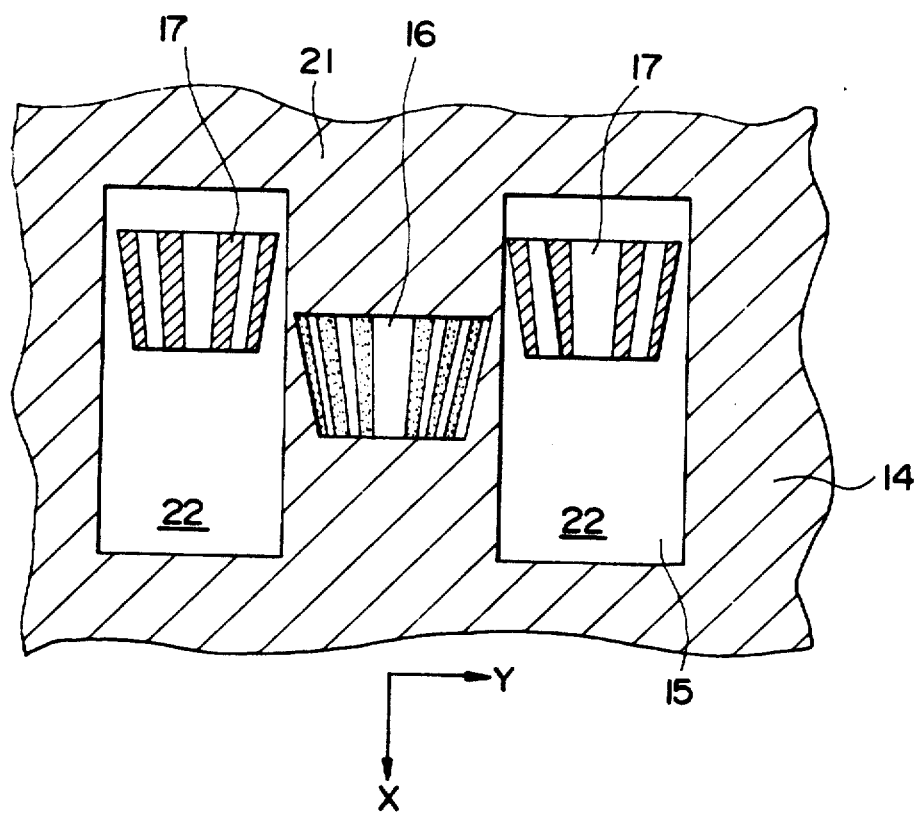
FIG. 4 is a top plan view of an alignment mark.
Figure 5A:
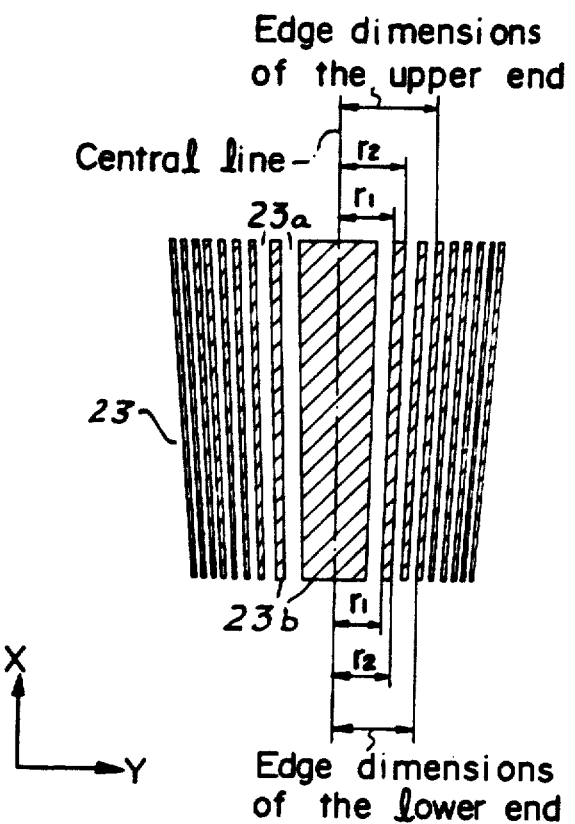
FIGS. 5A and 5B are a plan view of a SFZP and an explanatory diagram, respectively.
Figure 5B:
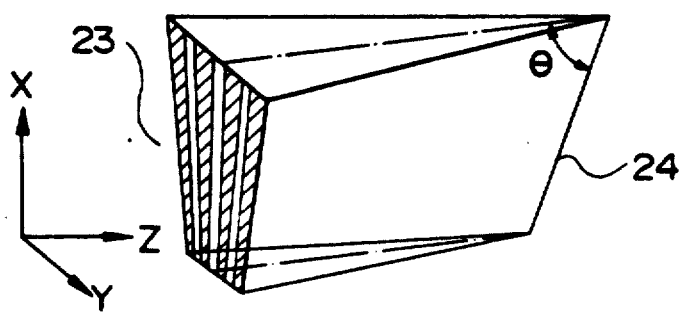

The alignment marks 16, 17 provided on the mask 14 and the wafer 15 are formed on the SFZPs which have their center lines in a direction X shown in FIGS. 2 and 4. As shown in FIG. 5A, an SFZP 23 includes a stripepattern comprised of a transparent zone 23a and an opaque zone 23b which extend radially. As seen from FIG. 5B, the SFZP 23 forms foci 24 in a straight line (Fresnel diffraction image) which is located in a plane perpendicular to the surface of the SFZP 23 and including the center line of the SFZP (the axis of symmetry in the center stripe) and is at an angle 0 with the direction Z. The focal length is reduced in proportion to reduction in width of the stripe and varies in accordance with wavelength.

Returning now to FIG. 4, a pair of wafer alignment marks 17 are formed on the SFZP as shown in FIG. 5A on the wafer 15 in a direction Y at a given interval. A mask alignment mark 16 is provided on the SFZP of the mask 14 between the pair of wafer alignment marks 17. A transparent mask window 22 (a part of a membrane where Tantalum is not formed), is provided on the mask 14 at a zone facing a zone on the wafer SFZP 17 where rays incident upon and diffracted by the SFZP 17 pass through the mask 14. The wafer alignment mark 17 is formed with a thin film such as a resist on the wafer 15.

Figure 6:
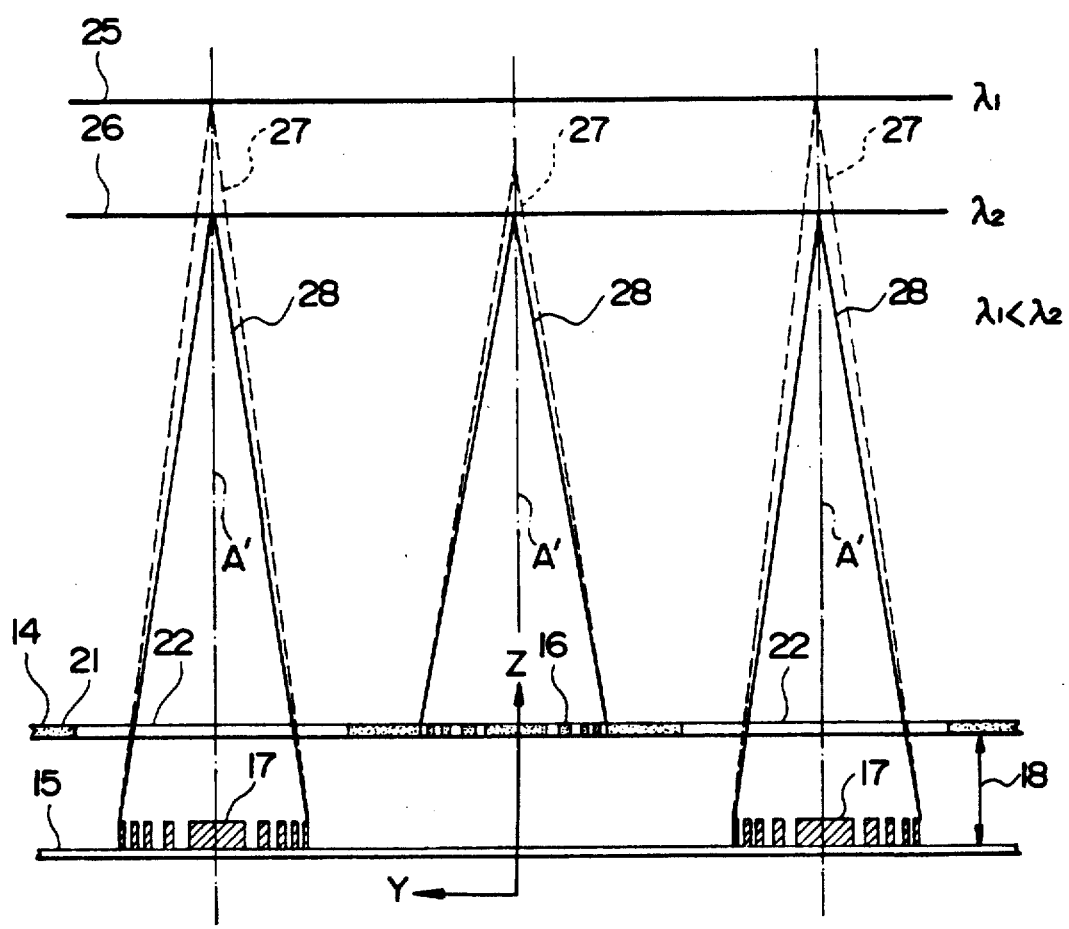
FIGS. 6 and 7 are diagrams for explaining Fresnel diffraction by alignment marks provided on the SFZP.
Figure 7:
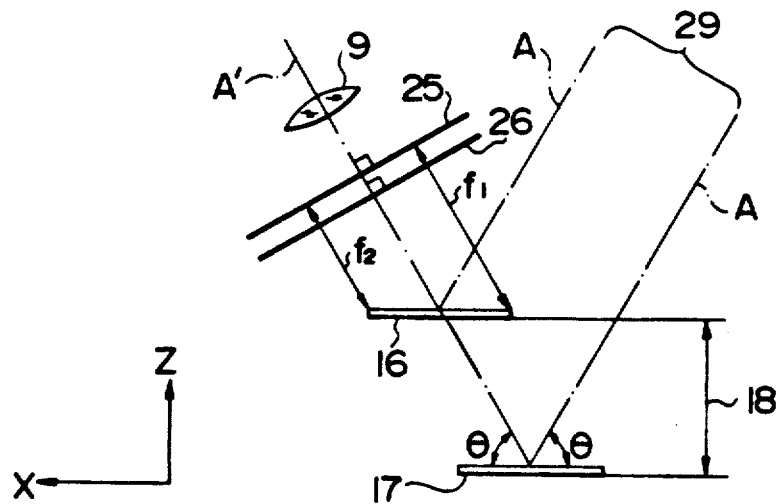

The mask 14 is superposed on the wafer 15 with a gap 18 ($\delta$ $\mu$m), as shown in FIGS. 6 and 7. When the mask 14 and wafer 15 are illuminated by light 29 of wavelengths $\lambda_1$ and $\lambda_2$ at the same time, two principal focal planes are formed by diffraction of the alignment marks 16,17 to light rays of $\lambda_1$ and $\lambda_2$. A difference between focal lengths fm and fw to the respective SFZPs 16, 17 on the detection optical axis A' is selected so as to be equal to a gap ($\delta/\sin\theta$) in the direction of the detection optical axis A' ($\delta/\sin\theta = $fw$-$fm). As shown in FIGS. 6 and 7, light rays of wavelengths $\lambda_1$ and $\lambda_2$ ($\lambda_1 < \lambda_2$) are diffracted by the mask and wafer to form focal planes 25 and 26, respectively, because a Fresnel focal length varis with a wavelength of an illumnation ray. When the focal lengths fm and fw are selected so as to have a large value as compared with the gap $\delta$; it may be considered that the focal planes of the SFZPs 16, 17 to each of rays of $\lambda_1$ and $\lambda_2$ substantially agree with each other in view of the relation $\delta/\sin\theta = $fw$-$fm, as shown in FIG. 6 and 7. However, the case when not in agreement will be described later.

The shapes of the SFZPs 16, 17 are selected such that the principal focal planes 25, 26 of the respective SFZP 16, 17 on the X-Z plane (a Fresnel diffraction image is on a straight line on the X-Z plane), are perpendicular to the optical axis A' of the detection optical system, as shown in FIG. 7.

The shape of the SFZP will be described hereinafter. In general, a Fresnel zone plate (FZP) is designed based on the following equation.

$$r_m^2 = mf\lambda + m^2 \frac{\lambda^2}{4} \quad (1)$$

where m: the number of order,
$r_m$: a distance of a zone edge of a mth order FZP from the center thereof,
f: the focal length of an FZP,
$\lambda$: a wavelength of an incident ray.

Figure 8:
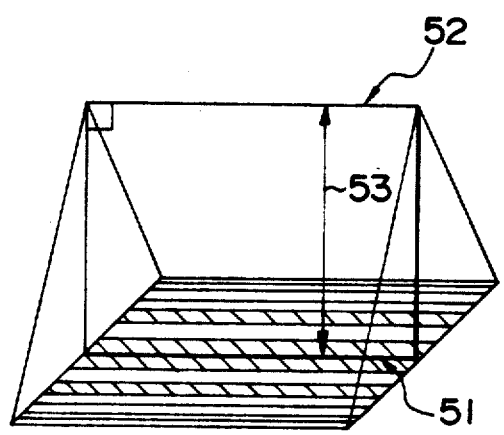
FIGS. 8 and 9 are diagrams for explaining position of focal planes produced by a LFZP and the SFZP.
Figure 9:
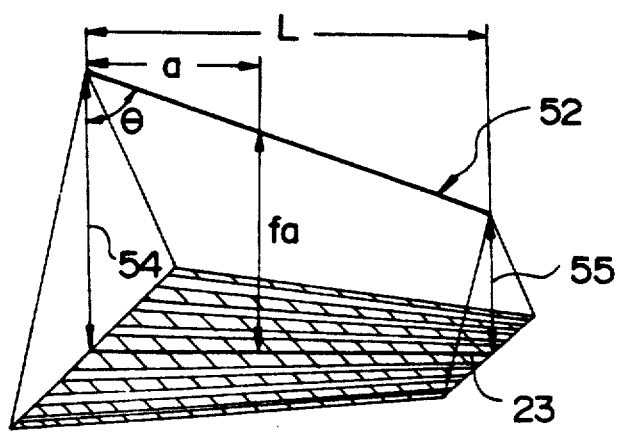

In the present invention, a conventional linear Fresnel zone plate is modified to the SFZP in the shape sector so that a principal focal plane makes an angle (45° to 85°) to the surface of the linear Fresnel zone plate. For example, a conventional linear Fresnel zone plate has a principal focal plane 52 at the position of the same focal length $f_{53}$ in a direction of the center line of a linear Fresnel zone plate 51, as shown in FIG. 8. In contrast, an SFZP 23 has a focal length f which continuously varies from $f_1$ of a length 54 to $f_2$ of a length 55 ($f_1 > f_2$), as shown in FIG. 9, so that the principal focal plane 52 has an angle with respect to the surface of the SFZP 23 (an angle $\theta$ showm in FIG. 9 is an angle between the optical axis to the SFZP and the principal focal plane 52).

A stripe-pattern of such SFZP is in a sector shape, as shown in FIG. 5A. In FIG. 5A, the stripe-pattern shape of the alignment mark on the upper end is expressed by the following equation.

$$r_m^2 = mf_1\lambda + m^2 \frac{\lambda^2}{4} \quad (2)$$

In addition, the stripe-pattern shape of the alignment mark on the lower end is expressed by the following equation.

$$r_m^2 = mf_2\lambda + m^2 \frac{\lambda^2}{4} \quad (3)$$

where m: the number of order,
$r_m$: a radius of a mth order band,
$f_1$: a focal length of the SFZP on the upper end,
$f_2$: a focal length of the SFZP on the lower end,
$\lambda$: a wavelength of an incident ray.

An angle $\theta$ between the principal focal plane and the optical axis is given by the following equation.

$$\theta = \tan^{-1} \frac{L}{f_1 - f_2} \quad (4)$$

where L represents a length of the SFZP.

When the angle $\theta$ is equalized to a detection angle 20 of the detection optical system 10 (FIG. 2), the Fresnel-focal planes 25, 26 of the SFZPs 16, 17 are perpendicular to the optical axis A' of the detection optical system 10. Assuming that $f_1$, $f_2$ represent focal lengths of the mask SFZP, focal lengths $f_3$, $f_4$ of the wafer SFZP 17 corresponding to $f_1$, $f_2$ are given by the following equation by adding an amount of a gap between the mask and wafer to $f_1$ and $f_2$.

$$f_3 = f_1 + \delta / \sin \theta \quad (5)$$

$$f_4 = f_2 + \delta / \sin \theta \quad (6)$$

where $f_3 > f_4$.

By the way, in FIG. 9 a focal length at a position which is apart from the left side of the alignment mark by a distance a is expressed by the following equation (7)

$$f_a = f_1 - a / \tan \theta \quad (7)$$

A stripe band at the position is a given by the following equation (8).

$$r_m^2 = mf_a\lambda + m^2 \frac{\lambda^2}{4} \quad (8)$$

The stripe band of the SFZP given by the equation (8) is on the band which is given by connecting points on both sides given by the equations (2) (3) with a straight line.

In the foregoing description regarding FIG. 7, it is considered that the principal focal planes of the mask mark 16 to rays of wavelengths $\lambda_1$ and $\lambda_2$ agree with those of the wafer mark 17 to the rays pf wavelengths $\lambda_1$ and $\lambda_2$. The case where the principal focal planes of the mask and wafer to the $\lambda_1$ and $\lambda_2$ rays do not agree with each other will be described hereinafter.

In FIG. 7, let two rays have respective wavelengths $\lambda_1$ and $\lambda_2 (\lambda_1 < \lambda_2)$. Focal lengths $f_1$, $f_2$ of the mask mark 16 to a ray of the wavelength $\lambda_1$ are found from the following equations (9) (10) on the basis of the equations (2) (3).

$$r_m^2 = mf_2\lambda_1 + m^2 \frac{\lambda_1^2}{4} \quad (9)$$

$$r_m^2 = mf_2\lambda_1 + m^2 \frac{\lambda_1^2}{4} \quad (10)$$

On the other hand, focal lengths $f_3$, $f_4$ of the wafer mask 17 to the ray of the wavelength $\lambda_1$ are found from the following equations (11) (12) on the basis of the equations (5) (6).

$$r_m^2 = mf_3\lambda_1 + m^2 \frac{\lambda_1^2}{4} \quad (11)$$

$$r_m^2 = mf_4\lambda_1 + m^2 \frac{\lambda_1^2}{4} \quad (12)$$

Shapes of the mask mark 16 and the wafer mark 17 are determined by employing the equations (9) through (12) so as to allow the principal focal plane of the mask mark 16 to agree with that of the wafer mark 17, with respect to the $\lambda_1$ ray. Next, focal lengths $f_5$, $f_6$ of the mask mark 16 and focal lengths $f_7$ and $f_8$ of the wafer mark 17 with respect to the second $\lambda_2$ ray are similary found. In the equation (9), let $r_1$ denotes a band radius of the mask mark 16 at m=1, then $$r_1^2 = f_5\lambda_2 + \frac{\lambda_2^2}{4} \quad (13)$$

-continued $$f_5 = \frac{1}{\lambda_2}\left[r_1^2 - \frac{\lambda_2^2}{4}\right]$$

In the equation (10), let $r_1$ denotes a band radius of the mask mark 16 at $m=1$, then $$r_1^2 = f_6\lambda_2 + \frac{\lambda_2^2}{4} \quad (14)$$

$$f_6 = \frac{1}{\lambda_2}\left[r_1^2 - \frac{\lambda_2^2}{4}\right]$$

In the same manner, in the equation (11), let $r_1$ denotes a band radius the wafer mark 17 at $m=1$, then $$r_1^2 = f_7\lambda_2 + \frac{\lambda_2^2}{4} \quad (15)$$

$$f_7 = \frac{1}{\lambda_2}\left[r_1^2 - \frac{\lambda_2^2}{4}\right]$$

In the equation (12), let $r_1$ denotes a band radius of the wafer mask at $m=1$, then $$r_1^2 = f_8\lambda_2 + \frac{\lambda_2^2}{4} \quad (16)$$

$$f_8 = \frac{1}{\lambda_2}\left[r_1^2 - \frac{\lambda_2^2}{4}\right]$$

In the equations (13) through (16), the same symbol $r_1$ is used for convenience in order to avoid complexity and would be essentially a different value.

Figure 10:
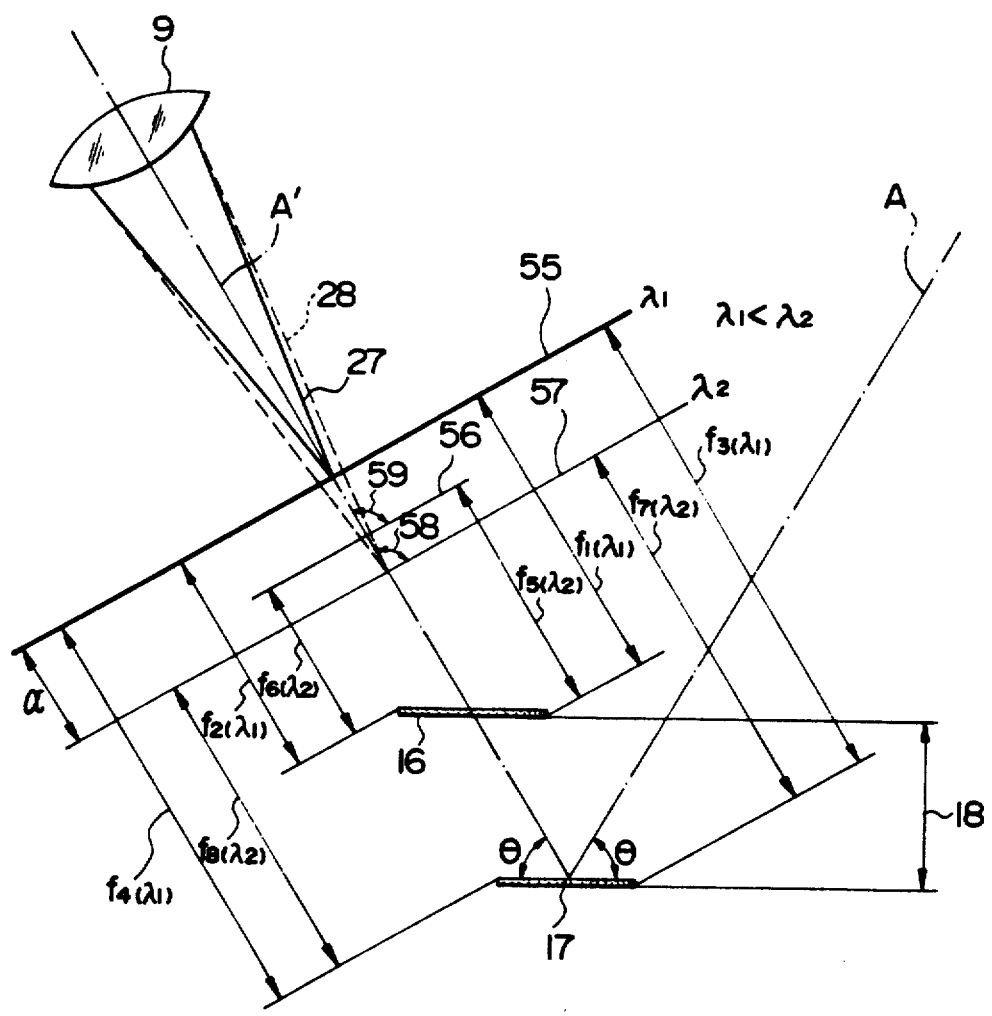
FIGS. 10, 12A and 12B are diagrams showing a relation between a Fresnel diffractionimage and a chromatic aberration double focus detection apparatus.

The relations among the focal lengths $f_1$ to $f_8$ given by the above equations (9) to (16) are shown in FIG. 10. In FIG. 10, a principal focal plane 55 is for the mask and wafer marks 16, 17 to the $\lambda_1$ ray and principal focal planes 56, 57 are for the mask and wafer marks 16, 17 to the $\lambda_2$ ray. As shown, the principal focal planes of the mask mark 16 to the $\lambda_1$ and $\lambda_2$ rays are not necessarily in agreement with these of the wafer mark 17 to the $\lambda_1$ and $\lambda_2$ rays. However, since a ray diffracted by the mask mark 16 has a stable and sufficient light intensity as compared with that by the wafer mark 17, (the light intensity of a Fresnel diffraction image varies in waves by being affected by variation in thickness of a lens and a mark and the like.) a Fresnel diffraction image for the $\lambda_1$ ray alone is detected and for the wafer mark 17 the sum of Fresnel diffraction images to two rays of wavelengths $\lambda_1$ and $\lambda_2$ is conveniently detected. This is applicable to the case where rays of three or more wavelengths are employed in principle.

In FIG. 10, an angle between the optical axis A of an incident ray and the surface of the marks 16, 17 is equal to that between the optical axis A' of detection ray and the surface of the marks 16, 17 which angle is equal to the angle $\theta$ between the principal focal planes of the marks 16, 17 and the optical axis A'. Strictly speaking, only the focal plane to the $\lambda_1$ ray is perpendicular to the optical axis A'. An angle between the diffraction focal plane to the $\lambda_2$ ray and the optical axis A' is not completely an angle of 90° and is slightly larger than 90°. It may be considered, however, that such angle be 90° because such difference is sufficiently covered in the scope of the depth of focus of the objective lens 9 (FIG. 2) in the detection optical system. In FIG. 10, the angle 58, 59 are not exactly 90°.

Figure 11:
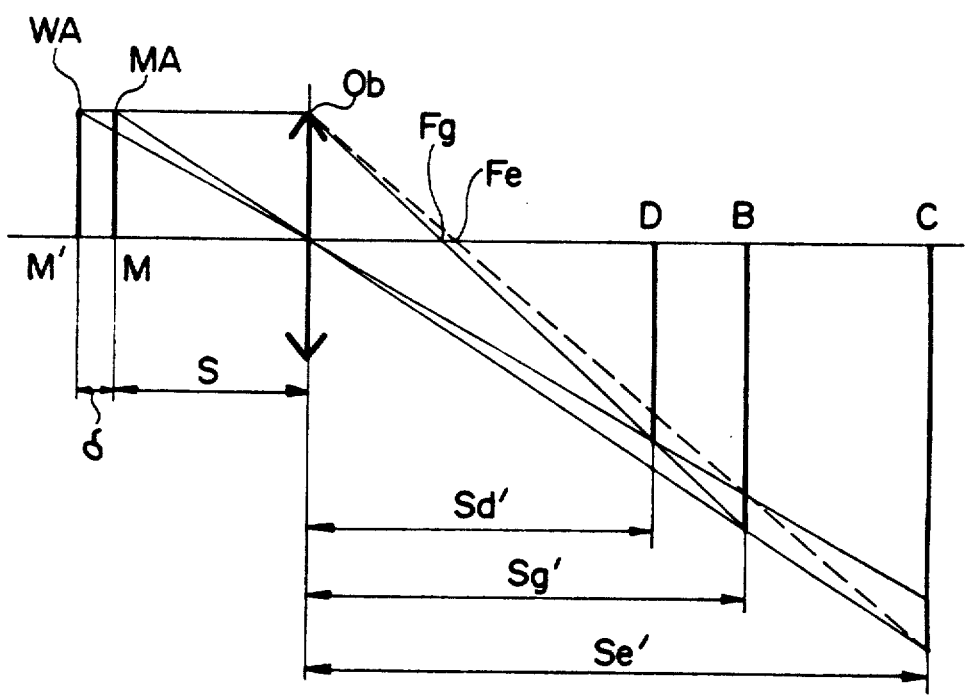
FIG. 11 is an optical path diagram for showing functions of an objective lens having an axial chromatic aberration.

A double focus detection optical system 12 shown in FIG. 2 which utilizes an axial chromatic aberration will be now described in the following. A basic system of the double focus detection has already been proposed in my Japanese Patent Application Sho 62-196174 and Hei 1-43292. In FIG. 11, an objective lens 0b has an axial chromatic aberration to rays of plural different wavelengths. By way of example, it has different focal lengths to two light of g ray ($\lambda=435$ nm) and e ray (546 nm). Accordingly, image points formed by a mark on the same body to g and e rays are different in position. For example, an objectivelens 0b of a numerical aperture NA=0.4 and a magnification n=10 has focal lengths of Fe=12.5 mm and Fg=12.741 mm to e and g rays respectively. Distances S' of an image point for a body with a distance S of 13.75 mm to g and e rays are S'g=137.5 mm and S'a=137.615 mm respectively. With the objective lens 0b, when two objects separated from each other by a very small distance $\delta$, for example a mask MA and a wafer WA are respectively placed at points M and M' on the optical axis, images of a mark on the mask MA to two g and e rays are formed at points D and B and images of a mark on the wafer WA to two g and e rays are formed at points B and C, respectively, because the focal lengths Fg and Fe to g and e rays are not the same. In other words, images of a mark on the mask MA and of a mark on the wafer WA are formed on the same position B by an axial chromatic aberration of the objective lens. However, the mark on the mask MA is an image formed by g ray.

Making observation by disposing a detection system such as a television camera at the point B, the marks on the mask MA and the wafer WA can be observed at the same time with images blurred due to the axial chromatic abberation. When a filter combination of a filter preventing g ray and admitting e ray and another filter admitting g ray and preventing e ray (the combined filter is called a pattern barrier filter) is employed, it is possible to observe images of the alignment marks on the mask and wafer which are located at different positions, at the same point B by eliminating blurring of an image due to an axial chromatic aberration (Japanese Patent Application Sho 62-196174).

When a pattern barrier filter is used, however, the scope of image formation is limited to reduce an observation field. In addition, speckles due to interference occuring between a pattern barrier filter and an image pickup place of a detection system exert a harmful influence. For this reason, I have proposed in Japanese Patent Application Hei 1-43092 to remove speckles by employing a band ray as an illumination ray.

Figure 21A:
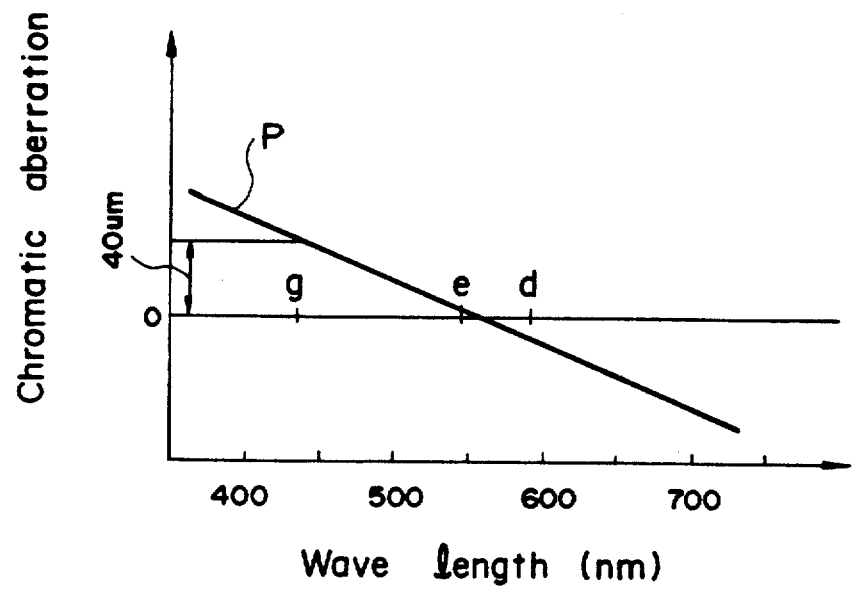
FIGS. 21A and 21B are diagrams for explaining the principle of an objective lens having an axial chromatic abberation.

In a position detector employing illumination light of a plurality of wavelengths, the proposed method employs a g ray (wavelength 436 nm) for a single light source and a ray including e ray (wavelength 546 nm) and d ray (wavelength 587 nm) for a band light source. When an alignment mark on a wafer is illuminated with the band ray to form an image through an objective lens in a detection system, a relation between wavelengths of illumination rays and an axial chromatic aberration of the objective lens is shown by a line P in FIG. 21A. Now assuming that axial chromatic aberration (focus shift) on the mask to g and e ray is 40 $\mu$m, this value corresponds to a gap $\delta$ between a mask and wafer.

Figure 21B:
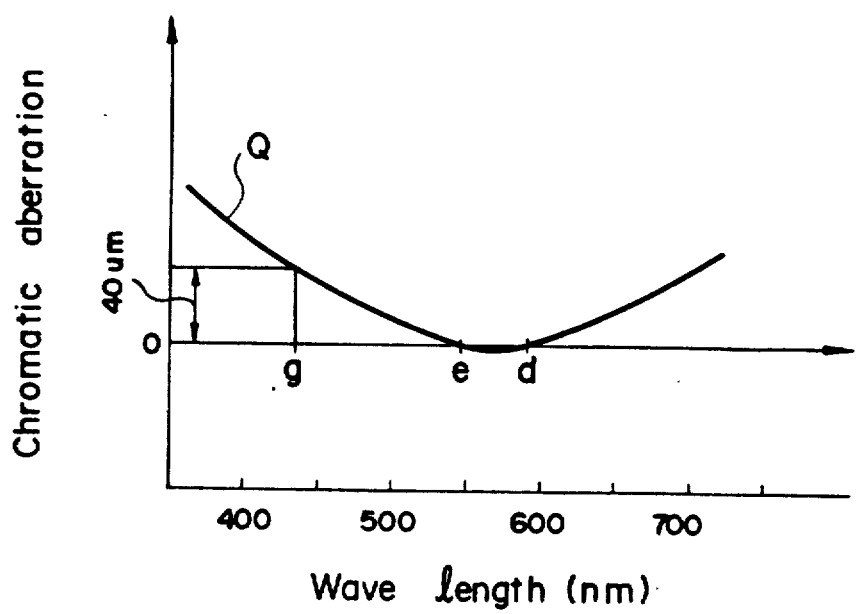

Therefore, it is considered that an image of an alignment mark on the mask to g ray and an image of an alignment mark on the wafer to e ray are formed on the same position. However, when compensation of chromatic aberration to d ray is effected by an achromat which is used for an ordinary achromatic lens in the chromatic aberration objective lens, so as to have an axial chromatic aberration as shown with a line Q in FIG. 21B, a chromatic aberration is compensated to a band ray in the region of e to d rays. As a result, it is possible to detect the alignment mark on the wafer with a required resolution at the same time.

Figure 22:
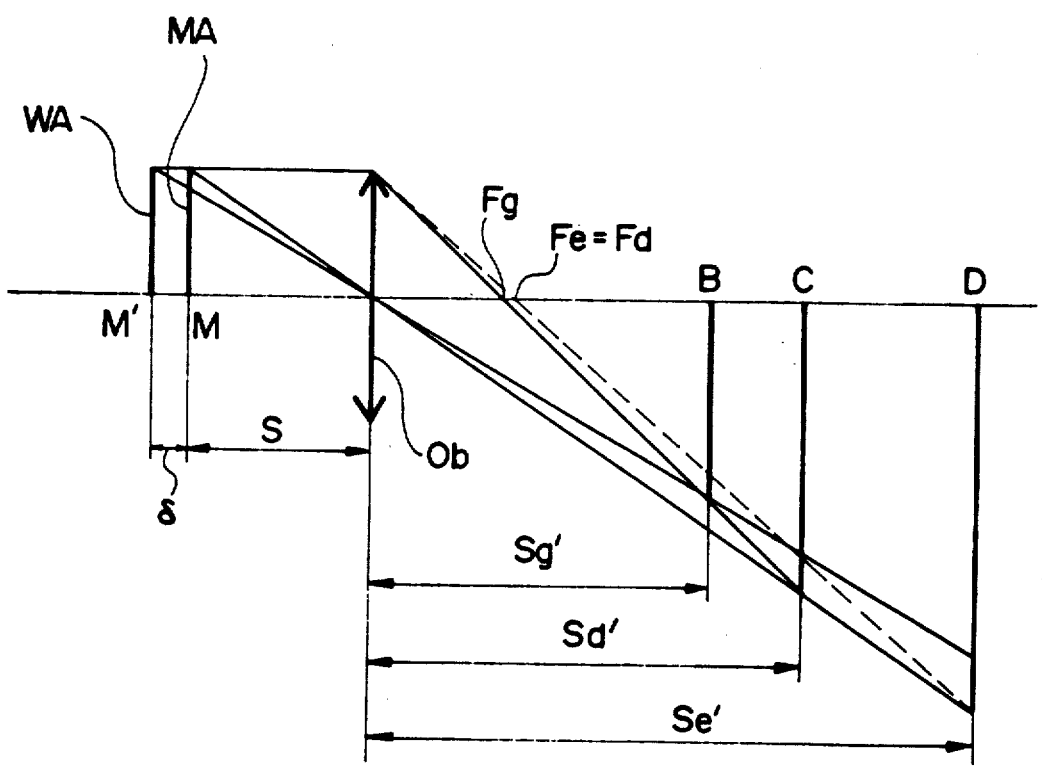
FIG. 22 is an optical path diagram for showing functions of an objective lens having a chromatic aberration.

At this time, as shown in FIG. 22, an image formed at points C and D on the optical axis by a band ray including e and d rays.

When a band ray selected from rays such as a halogen light or a xenon light passing through a band-pass filter is used for an illumination ray, its wave front is a group of the so-called incoherent rays which has an extremely reduced interference and is of incoherent phase, frequency and amplitude, so that there occurs no interference and hence no speckle which has an adverse effect upon a resolving power.

Consquently, an illumination system in a position detector employing plural light rays and a chromatic aberration double focus system has a structure of simultaneously illuminating two illumination rays of a single ray of g ray and a band ray (520 to 600 nm) in the region of e to d rays which pass through their respective band-pass filters. Thus, it is possible to dispense with a pattern barrier filter in a position detector according to the present invention.

Thus, the objective lens of the present invention is employed for positively causing its chromatic aberration to properly make compensation as described above.

In the present invention, the objective lens 9 in use has the properties similar to the objective lens 0b shown in FIG. 11. When the principal focal plane 25 of a Fresnel diffraction image to the $\lambda_1$ ray as shown in FIG. 6 is disposed at the position WA shown in FIG. 11 and the principal focal plane 26 of a Fresnel diffraction image to the $\lambda_2$ ray is disposed at the position MA shown in FIG. 11, alternatively the principal focal plane 55 of a Fresnel diffraction image to the $\lambda_1$ ray in FIG. 10 is disposed at the position WA shown in FIG. 11 and the focal plane 57 to the $\lambda_2$ ray is disposed at the position MA shown in FIG. 11, Fresnel diffraction images of the SFZPs 16, 17 to the $\lambda_1$ ray and Fresnel diffraction images of the SFZPs 16, 17 to the $\lambda_2$ ray are formed respectively in superimposed relationship at the position B shown in FIG. 11. This will be described with reference to FIG. 12. The principal focal plane 25 of Fresnel diffraction images formed by the alignment marks 16, 17 to the $\lambda_1$ ray and the principal focal plane 26 of Fresnel diffraction images formed by the alignment marks 16, 17 to the $\lambda_2$ ray are arranged so as to completely agree with the double focal planes of the objective lens 9 to the $\lambda_1$ and $\lambda_2$ rays in position, respectively. As a result, both the focal planes 25, 26 are superposingly formed on the linear sensor 6 through the objective lens 9 and the relay lens 8.

In addition, the positional relationship between the focal planes of the detection optical system and the principal focal planes of Fresnel diffraction images is shown in FIG. 10. The foregoing will be further described in detail with reference to FIG. 10. The objective lens 9 having an axial chromatic aberration in the detection optical system has two focal planes to two rays of wavelength $\lambda_1$ and $\lambda_2$ ($\lambda_1 < \lambda_2$) as shown in FIG. 10. The focus of the objective lens 9 to the $\lambda_2$ ray is far from the objective lens. Let an interval between two foci of the objective lens 9 be $a$ ($\mu$m).

On the other hand, the positional relationship of the principal focal planes 55, 56, 57 of the SFZPs 16, 17 is the reverse to that of the focal planes of the objective lens 9: the longer a wavelength the shorter a focal length. Namely, the ray of smaller $\lambda_1$ has a larger focal length as compared with the ray of larger $\lambda_2$. This is obvious from the basic equations (2) (3). By way of example, this fact is proved by studying the principal focal lengths $f_1$, $f_2$ of an FZP to the $\lambda_1$ and $\lambda_2$ rays.

From the equations (2) (3), a band radius of an FZP at $m=1$ is found as follows.

$$r_1{}^2 = f_1 \lambda_1 + \lambda_1{}^2/4 \qquad (17)$$

$$r_1{}^2 = f_2 \lambda_2 + \lambda_2{}^2/4 \qquad (18)$$

From these equations (17) (18), $$f_1 = \frac{1}{\lambda_1}(r_1{}^2 - \lambda_1{}^2/4) \qquad (19)$$

$$f_2 = \frac{1}{\lambda_2}(r_1{}^2 - \lambda_2{}^2/4) \qquad (20)$$

Then, $$f_1 - f_2 = \frac{\lambda_2(4r_1{}^2 - \lambda_1{}^2) - (4r_1{}^2 - \lambda_2{}^2)}{4\lambda_1\lambda_2}$$

$$= \frac{4r_1{}^2(\lambda_2 - \lambda_1) - \lambda_1\lambda_2(\lambda_2 - \lambda_1)}{4\lambda_1\lambda_2} > 0$$

$$\therefore f_1 > f_2 \qquad (21)$$

The characteristic relation of the SFZP shown by the equation (21) is very convenient to utilize the SFZP in combination with the detection optical system. As shown in FIG. 10, because of the characteristic of the FZP, the focal planes of the objective lens 9 to the $\lambda_1$ and $\lambda_2$ rays agree with the respective principal focal planes 55 of Fresnel diffraction images formed by the SFZPs 16, 17 (the principal focal plane of Fresnel diffraction images formed by the mask mark 16 to the $\lambda_1$ ray and formed by the wafer mark 17 to the $\lambda_2$ ray) and the principal focal plane 57 of Fresnel diffraction images formed by SFZPs 16, 17 (the principal focal plane of a Fresnel diffraction image formed by the wafer mark 17 to the $\lambda_2$ ray). What is important in this fact is that the principal focal plane 56 of a Fresnel diffraction image formed by the mask mark 16 to the $\lambda_2$ ray is not detected because it it out of the focal planes of the objective lens. This is basically based on the assumption that since a Fresnel diffraction image formed diffracted rays from the mask mark 16 has always a stable and strong light intensity as compared with that from the wafer mark 17, a Fresnel diffraction image to an incident ray of a single wavelength ($\lambda_1$) is detected. On the other hand, in regard to the wafer mark 17, the sum of Fresnel diffraction images to rays of multiple wavelengths $\lambda_1$ and $\lambda_2$ is detected. This is applicable in principle to the case where three or more wavelengths for incident light are employed. That is, for the mask mark 16, Fresnel diffraction images to the $\lambda_1$ ray are detected and for the wafer mark 17, Fresnel diffraction images to incident rays of multiple wavelengths $\lambda_1, \lambda_2, \lambda_3$ ... are detected.

Figure 13A:
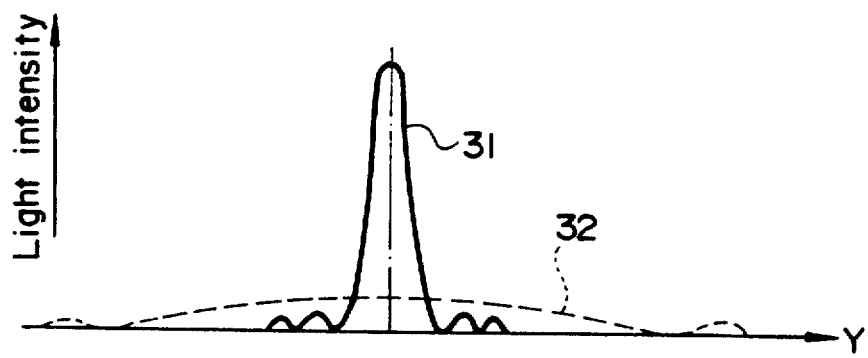
FIGS. 13A-13C are diagrams showing light intensity distributions of a Fresnel diffraction image on a Fresnel focal plane and an image forming plan.

Now, a situation that a plurality of Fresnel diffraction images formed by the wafer mark is formed on the same image plane by the chromatic aberration double focus optical system and a distribution of light intensity of a Fresnel diffraction image formed on the linear sensor 6 will be described with reference to FIG. 13. FIG. 13(a) shows a distribution of light intensity of a Fresnel diffraction image on the principal focal plane 25 (55) of the wafer mark 17 to the $\lambda_1$ ray. A distribution of light intensity of Fresnel diffraction image on the principal focal plane 2 to the $\lambda_1$ ray is shown by a solid line 31.

Figure 13B:
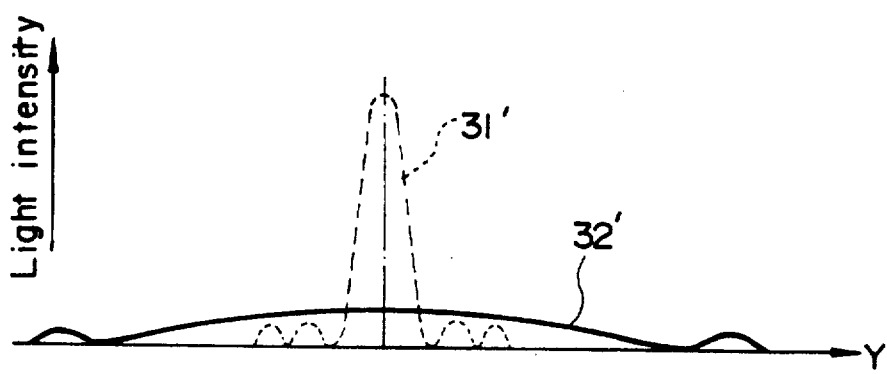

On the other hand, since Fresnel diffraction images to the $\lambda_2$ ray are far from the focus, a light intensity 32 is very weak and a distribution of light intensity is of a low and gentle slope. FIG. 13(b) shows a distribution of light intensity of Fresnel diffraction images on the principal focal plane 26 (57) formed by the wafer mark 17 to the $\lambda_2$ ray. On the other hand, since Fresnel diffraction images to the $\lambda_1$ ray are far from the focus, an intensity of the Fresnel images is very weak and the distribution of light intensity is of a low and gentle slope, as shown in FIG. 13(b) with a solid line 32'.

Figure 13C:
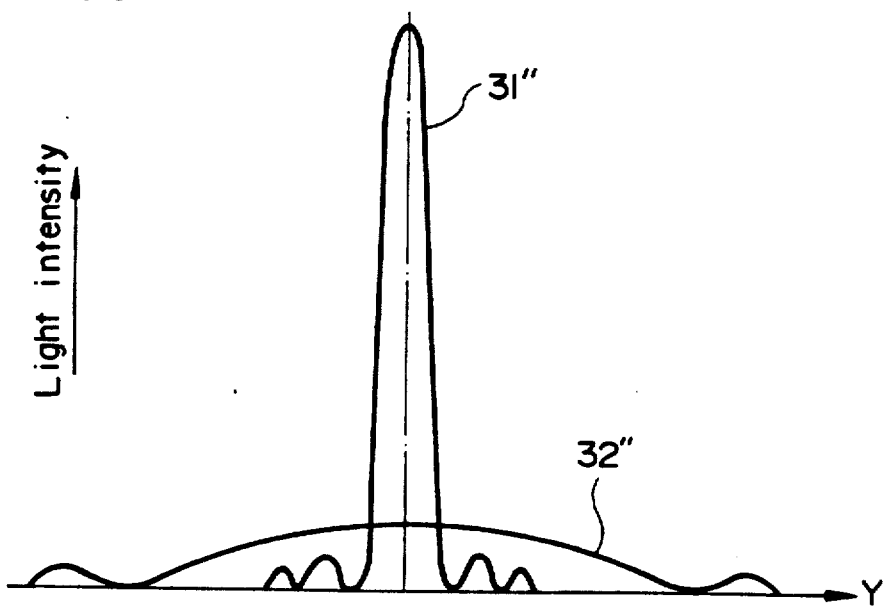

FIG. 13(c) shows the distribution of light intensity of Fresnel diffraction images of the mask and wafer mark 16, 17 to the $\lambda_1$ and $\lambda_2$ rays with the chromatic aberration double focus optical system. The distribution of light intensity on the linear sensor 6, since a ray of each wavelength is coherent and does not interfere with one another, is obtained basically as the sum 31", 32", of light intensities on the focal plane to the $\lambda_1$ and $\lambda_2$ rays. Namely, the light intensity is expressed as follows:

(An intensity of Fresnel diffraction images on the image forming plane 6) = (an intensity of Fresnel diffraction image on the focal plane 25 to the $\lambda_1$ ray) + (an intensity of Fresnel diffraction image on the focal plane 26 to the $\lambda_2$ ray).

As a result of the addition, a peak value of a peak signal to be used as an alignment signed which is obtained from the linear sensor 6 is doubled and a signal-to-noise ratio is also improved.

Figure 12A:
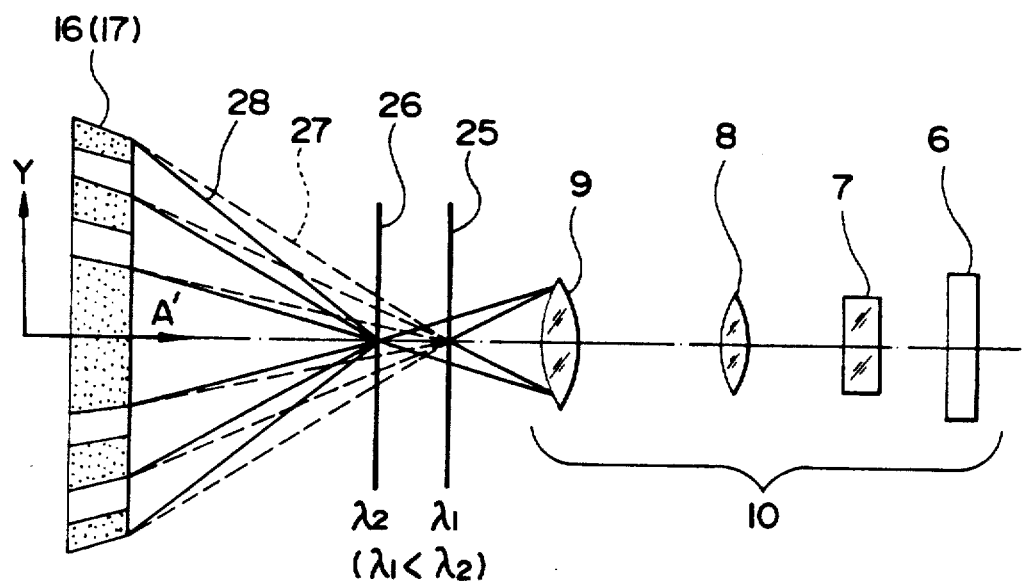

The operation of the cylindrical lens 7 shown in FIG. 2 and FIGS. 12A and 12B will be described hereinafter. In detection of Fresnel diffraction image of the mask and wafer marks 16, 17 by a two dimensional camera, which image is magnified in a double focus optical system 12 utilizing an axial chromatic aberration, a detection speed of the camera is 30 Hz and it is difficult to increase the detection speed more than that.

Figure 12B:
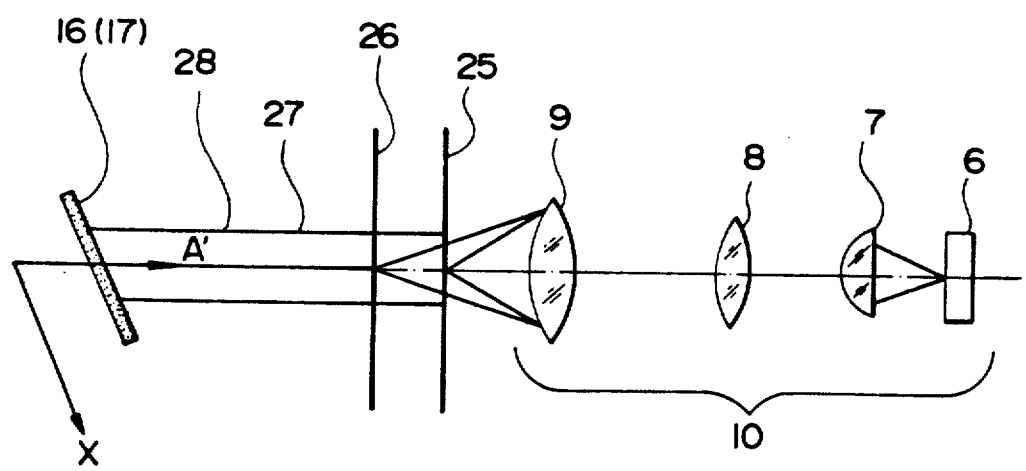

Moreover, the Fresnel diffraction image is in a straight line extending perpendicularly to the optical axis A' in the sheet surface in FIG. 12B and it is necessary to effect a digital raster compression operation, so that a handling speed of the image signal is greatly reduced. For this reason, when the focus image is detected by the linear sensor 6 of one dimensional solid-state camera such as a CCD (charge coupled device) and a MOS type LSI, in place of a two dimensional camera, the detection speed can be much raised to nearly 10 KHz.

Figure 14:
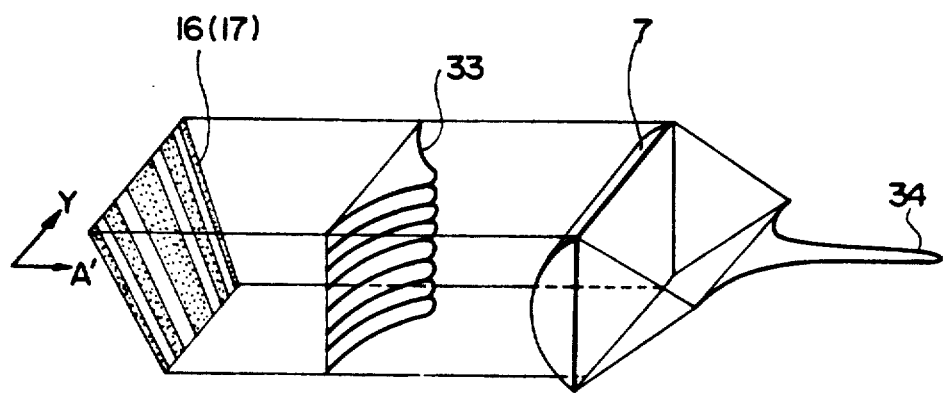
FIG. 14 is an explanatory diagram showing an optical raster compression by a cylindrical lense.

Since the linear sensor 6 is disposed in the direction Y perpendicular to the Fresnel diffraction image in a straight line, only a part of the image is detected by the linear sensor 6. To eliminate such disadvantage, a cylindrical lens 7 is provided which compresses the Fresnel diffraction image in a straight line extending perpendicularly to the optical axis A' on the sheet surface in FIG. 12B in the direction of the image, so as to be capable of detecting the image more effectively. This will be described with reference to FIG. 14, in which a single SFZP is shown as an example and an objective lens 9 is omitted. When a cylindrical lens 7 having its generating lines in a direction (Y) perpendicular to the center stripe band of the SFZP 16 or 17 is disposed to compreses the light intensity distribution 33 of a Fresnel diffraction image of the SFZP 16 or 17 in a straight line extending perpendicularly to the optical axis A', the resulting distribution 34 assumes a shape as shown in FIG. 14, which makes it possible to allow the amount of rays as much as multiplied by a compression factor to strike the linear sensor 6 which is disposed in the direction Y. When the compression in a direction perpendicular to the generating line of the cylindrical lens 7 is made by a reduction factor of 10, then the light amount and hence the signal intensity is increased by about ten times, to be sufficient for detection.

In addition, the use of the cylindrical lens 7 makes it possible to allow a raster compression to be achieved optically rather than digitally in a conventional manner and the raster compression time is substantially reduced to zero. As a result, a detection speed required for the raster compression and signal detection is nearly 10 KHz per scanning to be an extremely high speed. Moreover, nonessential white noise components to get mixed in raster scanning is reduced with the result of a high signal-to-noise ratio.

The use of a cylindrical lens in the foregoing has been proposed in my Japanese Patent Application Sho 63-63921.

A signal handling apparatus 30 C FIGS. 2 and 3 which handles a signal obtained by the linear sensor 6 to detect a position will be described in the following. The signal handling apparatus 30 employs a similar pattern matching method as one of signal handling methods.

The similar pattern matching method is to obtain a distance between two signals with similar form in an extremely short time by finding correlation between the two signal (autocorrelations in this case). A similar pattern matching operation is expressed in a definition given by the following formula (22) which is mathematically equivalent to an autocorrelation formula.

$$A(W,P) = \sum_{j=1}^{R} V'(P+j) \times V'(P+W+j) \quad (22)$$

where
- P: Initial point of a correlated section,
- R: Correlated section,
- W: Width between right and left patterns,
- V' (j): First order differentiated value of a picture image input value V (j) at a picture element j.

A point of difference between the foregoing operations is that parameters are separated and a proper value is substituted for respective separated parameters to extremely reduce a handling time. This advantage is derived from the characteristics of an alignment mark. Namely, it is based on the fact that an alignment mark has a constant stripe-pattern shape and a distance between alignment marks is constant.

According to the formula (22), a handling time is reduced to one-several thousandths as compared with a general autocorrelation by inputting a proper parameter.

Figure 15A:
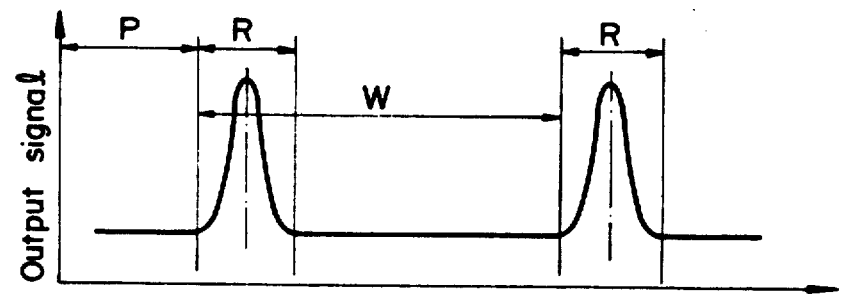
FIGS. 15A and 15B are diagrams for explaining a similar pattern matching method.
Figure 15B:
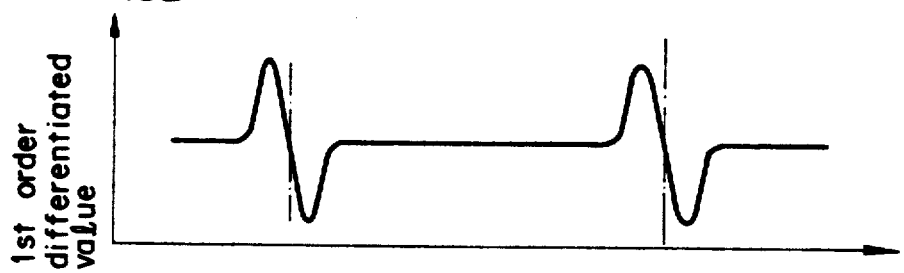

The application of the formula (22) will be described with reference to FIGS. 15A and 15B. FIG. 15A shows output signals of Fresnel diffraction images formed on a line sensor. FIG. 15B shows first order differentiated signals after the output signals shown in FIG. 15A are quantitized.

The similar pattern matching method is applied to data of discrete quantities shown in FIG. 15B (FIG. 15B gives an illustration as a continuous value).

The function A (W,P) is very sensitive to W. The procedure of finding a distance is that a value $W_1$ which makes A(W,P) maximum and a value $W_2$ which makes A (W,P) the second in value are found and interpolation is further applied to make accurate.

Discreteness is determined by an optical magnification and a resolving power of a line sensor. In a signal handling apparatus of the present invention, discreteness is 0.2 $\mu$m / pixel to 0.1 $\mu$m /pixel. With the apparatus, the handling time including the similar pattern matching operation from interpolation to a final detection of a relative position is within 30 m sec by using a personal computer (32 bit, Nippon Electric Co, PC 980 (RA).

Figure 16A:
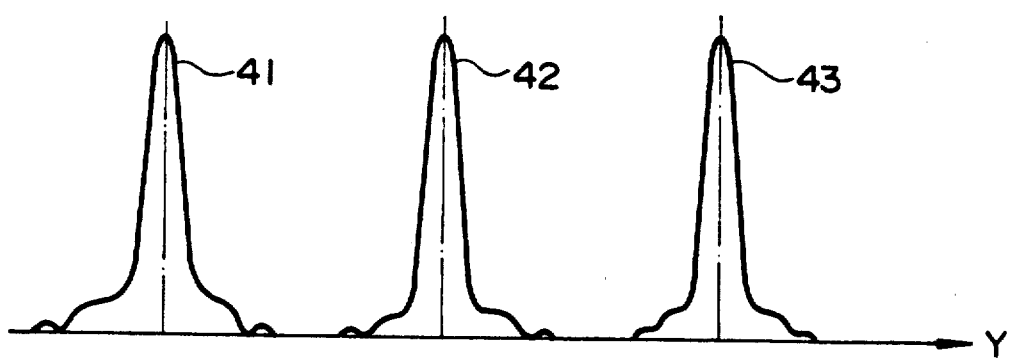
FIGS. 16A and 16B are diagrams respectively showing waveforms of a detected signal and its first order differentiated signal.
Figure 16B:
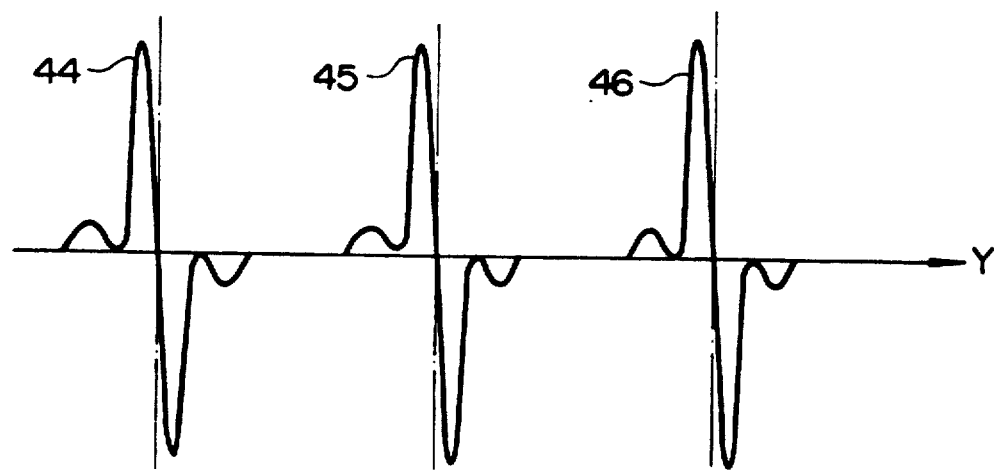

Signals obtained by the linear sensor 6 are shown in FIG. 16A. The positional relationship between these signals is that signals 41, 43 of the wafer mark 16 are on both sides of a signal 42 of the mask mark 16. These output signals are converted by an A/D converter into a digital signals and undergo a first order differentiating operation at obtain signals as shown in FIG. 16B. Signals 44, 46 are related to the wafer mark and a signal 45 is related to the mask mark. When these differentiated signals undergo the above mentioned similar pattern matching method, for example, it is possible to detect a relative position between the mask 14 and the wafer 15 in the direction Y (FIGS. 3 and 6).

Figure 17:
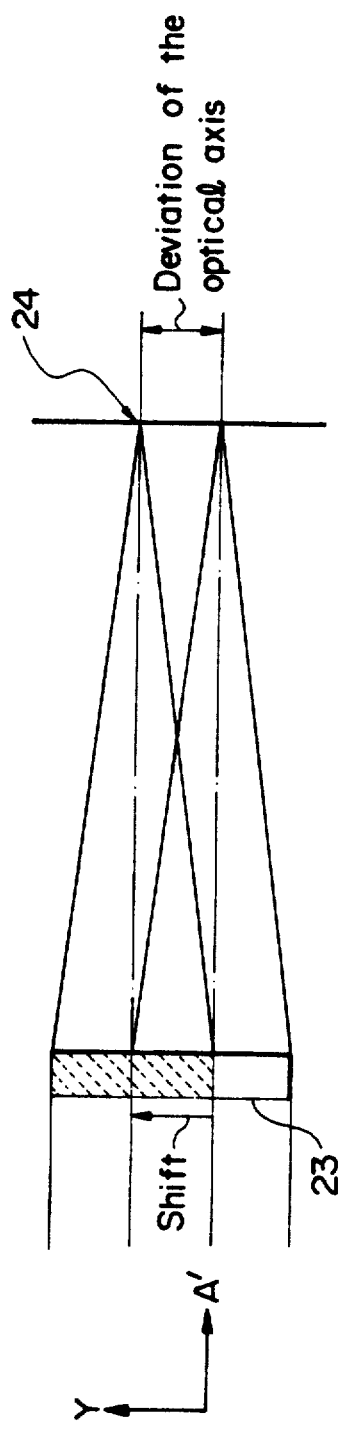
FIGS. 17 and 18 are diagrams for explaining the, principle of aligning operation of the present invention.

The principle of detecting a relative position between the mask mark 16 and the wafer mark 17 by employing the position detector of the present position will now be described below. In general, an SFZP acts substantially in the same manner as a convex cylindrecal lens. In FIG. 17, a SFZP 23 which makes an angle $\theta$ with the sheet surface in FIG. 17 has foci 24 on a straight line perpendicular to the sheet surface. Consequently, when a SFZP on a mask or a wafer moves by $\Delta \delta$ $\mu$m in a direction Y perpendicular to the center line of the SFZP, its foci also move by the same amount $\Delta \delta$ $\mu$m in the same direction. It is possible to regard the movement of the foci as a deviation ($\Delta \delta$ $\mu$m) of the SFZP. Thus, the movement of the focus, that is, a relative position between the mask and wafer can be find by detecting a deviation of the foci.

Figure 18:
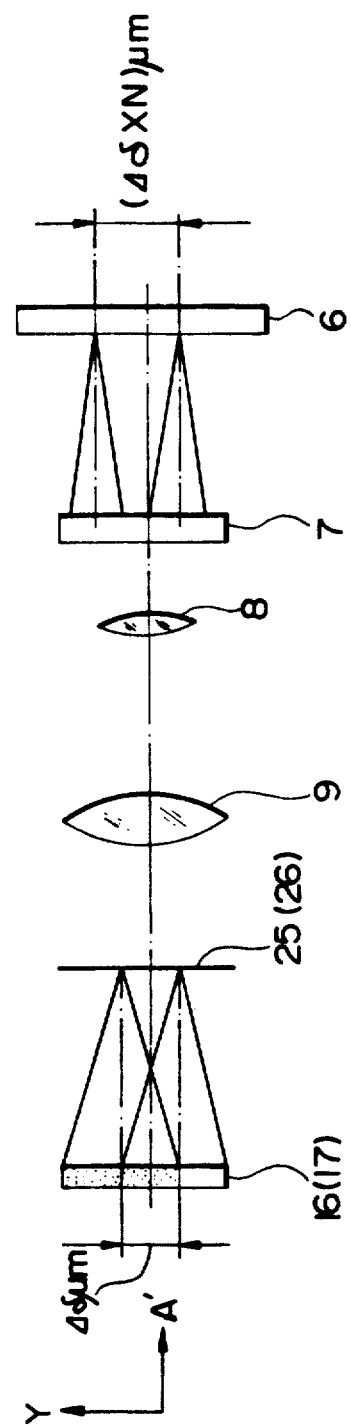

In summary of the present invention, the SFZPs provided on the mask and wafer are simultaneously illuminated by rays of a plurality of wavelengths (not limited to two wavelengths in principle). Fresnel diffraction image on the principal focal plane of the SFZPs, focal lengths of which vary with the wavelength, are allowed to form on the image forming plane by the objective lens having an axial chromatic aberration. The movement of the focus is magnified by the objective lens by a magnification factor N and then applied to the linear sensor which scans in the direction Y. As shown in FIG. 18, the movement of the focus of the mask 16 or the wafer 17 on the linear sensor 6 is magnified to ($\Delta \delta \times N$) $\mu$m. A signal from the linear sensor 6 is handled to detect a relative position between the marks on the mask and wafer. At this time, the cylindrical lens 7 acts to compress the Fresnel diffraction image in a straight line extending perpendicularly to the sheet surface and the optical axis A', in the direction of the image to increase a signal intensity and hence the handling speed.

The rough specifications of an alignment apparatus employing the position detector of the present invention are as follows.

1. Alignment mark:
   Wafer mark = SFZP × 2
   Mask mark = SFZP × 1
2. Detection signal: A Fresnel diffraction images to rays of wavelengths $\lambda_1$ and $\lambda_2$.
3. Detection apparatus: Double focus optical system utilizing an axial chromatic aberration and an optical raster compression system by a cylindrical lens (which is not necessarily required).
4. Light sensitive element: Linear sensor
5. Signal handling method: Detection of a position of alignment mark by a similar pattern matching method and like.

An example of practical design of the SFZP 23 shown in FIG. 5A is as follows.
Gap between a mask and wafer: $\delta = 40$ $\mu$m
Wavelength of incident light:
   $\lambda_1 = 488$ nm (Blue light)
   $\lambda_2 = 632.8$ nm (Green light)
Length of the SFZP: L = 60 $\mu$m
Angle of incidence: $\theta = 60°$.

Assuming that the above data are initial conditions, an example of design for $f_3 = 100$ $\mu$m is as follows.

In the following, a dimension of edge is determined as shown in FIG. 5A.

Let the maximum number of orders be 21, dimensions of edges up to $r_{21}$ are given. Figures in parentheses in Table denote a distance between edges.

① $f_3 = 100$ (Unit $\mu$m)
$f_1 = 53.81$
$f_2 = 23.81$
$f_3 = 100$
$f_4 = 70$
$f_5 = 41.43$
$f_6 = 18.30$
$f_7 = 77.05$
$f_8 = 53.92$.

TABLE

| Wafer mark | | | |
|---|---|---|---|
| (Dimension of the upper end edges) | | (Dimension of the lower end edge) | |
| $r_1$ = 6.98996 | (6.98996) | $r_1$ = 5.84975 | (5.84975) |
| $r_2$ = 9.89132 | (2.90136) | $r_2$ = 8.27998 | (2.43024) |
| $r_3$ = 12.1217 | (2.23039) | $r_3$ = 10.1497 | (1.86969) |
| $r_4$ = 14.0054 | (1.88374) | $r_4$ = 11.73 | (1.58031) |
| $r_5$ = 15.6681 | (1.66263) | $r_5$ = 13.1259 | (1.39588) |
| $r_6$ = 17.1739 | (1.50584) | $r_6$ = 14.3911 | (1.26522) |
| $r_7$ = 18.5612 | (1.38726) | $r_7$ = 15.5575 | (1.16646) |
| $r_8$ = 19.8547 | (1.29355) | $r_8$ = 16.646 | (1.08848) |
| $r_9$ = 21.0718 | (1.21711) | $r_9$ = 17.671 | (1.02492) |
| $r_{10}$ = 22.2251 | (1.15323) | $r_{10}$ = 18.6428 | (0.971838) |
| $r_{11}$ = 23.3239 | (1.09882) | $r_{11}$ = 19.5695 | (0.926674) |
| $r_{12}$ = 24.3757 | (1.05178) | $r_{12}$ = 20.4571 | (0.887648) |
| $r_{13}$ = 25.3862 | (1.01058) | $r_{13}$ = 21.3106 | (0.853491) |
| $r_{14}$ = 26.3604 | (0.974125) | $r_{14}$ = 22.1339 | (0.823288) |
| $r_{15}$ = 27.3019 | (0.941565) | $r_{15}$ = 22.9302 | (0.796349) |
| $r_{16}$ = 28.2142 | (0.912271) | $r_{16}$ = 23.7023 | (0.77211) |
| $r_{17}$ = 29.0999 | (0.885721) | $r_{17}$ = 24.4525 | (0.750183) |
| $r_{18}$ = 29.9615 | (0.861542) | $r_{18}$ = 25.1827 | (0.730198) |
| $r_{19}$ = 30.8009 | (0.839388) | $r_{19}$ = 25.8946 | (0.711912) |
| $r_{20}$ = 31.6198 | (0.818981) | $r_{20}$ = 26.5897 | (0.695107) |

TABLE-continued

| $r_{21} =$ 32.42 | (0.800152) | $r_{21} =$ 27.2693 | (0.679569) |

Mask mark

| (Dimension of the upper end edge) | | (Dimension of the lower end edge) | |
|---|---|---|---|
| $r_1 =$ 5.13019 | (5.13019) | $r_1 =$ 3.41743 | (3.41743) |
| $r_2 =$ 7.26338 | (2.13319) | $r_2 =$ 4.84528 | (1.42785) |
| $r_3 =$ 8.90582 | (1.64244) | $r_3 =$ 5.94926 | (1.10398) |
| $r_4 =$ 10.2951 | (1.38931) | $r_4 =$ 6.88692 | (0.937665) |
| $r_5 =$ 11.5232 | (1.2281) | $r_5 =$ 7.71912 | (0.832196) |
| $r_6 =$ 12.6372 | (1.11398) | $r_6 =$ 8.47697 | (0.757849) |
| $r_7 =$ 13.665 | (1.02779) | $r_7 =$ 9.1789 | (0.701934) |
| $r_8 =$ 14.6248 | (0.959789) | $r_8 =$ 9.83689 | (0.657994) |
| $r_9 =$ 15.5292 | (0.904408) | $r_9 =$ 10.4593 | (0.622357) |
| $r_{10} =$ 16.3874 | (0.858191) | $r_{10} =$ 11.052 | (0.592732) |
| $r_{11} =$ 17.2063 | (0.81889) | $r_{11} =$ 11.6196 | (0.567649) |
| $r_{12} =$ 17.9912 | (0.784958) | $r_{12} =$ 12.1657 | (0.546078) |
| $r_{13} =$ 18.7465 | (0.755291) | $r_{13} =$ 12.693 | (0.527289) |
| $r_{14} =$ 19.4756 | (0.729076) | $r_{14} =$ 13.2038 | (0.51075) |
| $r_{15} =$ 20.1813 | (0.705696) | $r_{15} =$ 13.6998 | (0.496059) |
| $r_{16} =$ 20.866 | (0.684698) | $r_{16} =$ 14.1827 | (0.482916) |
| $r_{17} =$ 21.5317 | (0.665691) | $r_{17} =$ 14.6538 | (0.471068) |
| $r_{18} =$ 22.1801 | (0.648409) | $r_{18} =$ 15.1141 | (0.460328) |
| $r_{19} =$ 22.8127 | (0.632591) | $r_{19} =$ 15.5647 | 0.450541) |
| $r_{20} =$ 23.4307 | (0.618059) | $r_{20} =$ 16.0062 | (0.441583) |
| $r_{21} =$ 24.0354 | (0.604647) | $r_{21} =$ 16.4396 | (0.433346) |

The supplementary description of a transparent window section provided on the mask will be described in the following.

Figure 19:
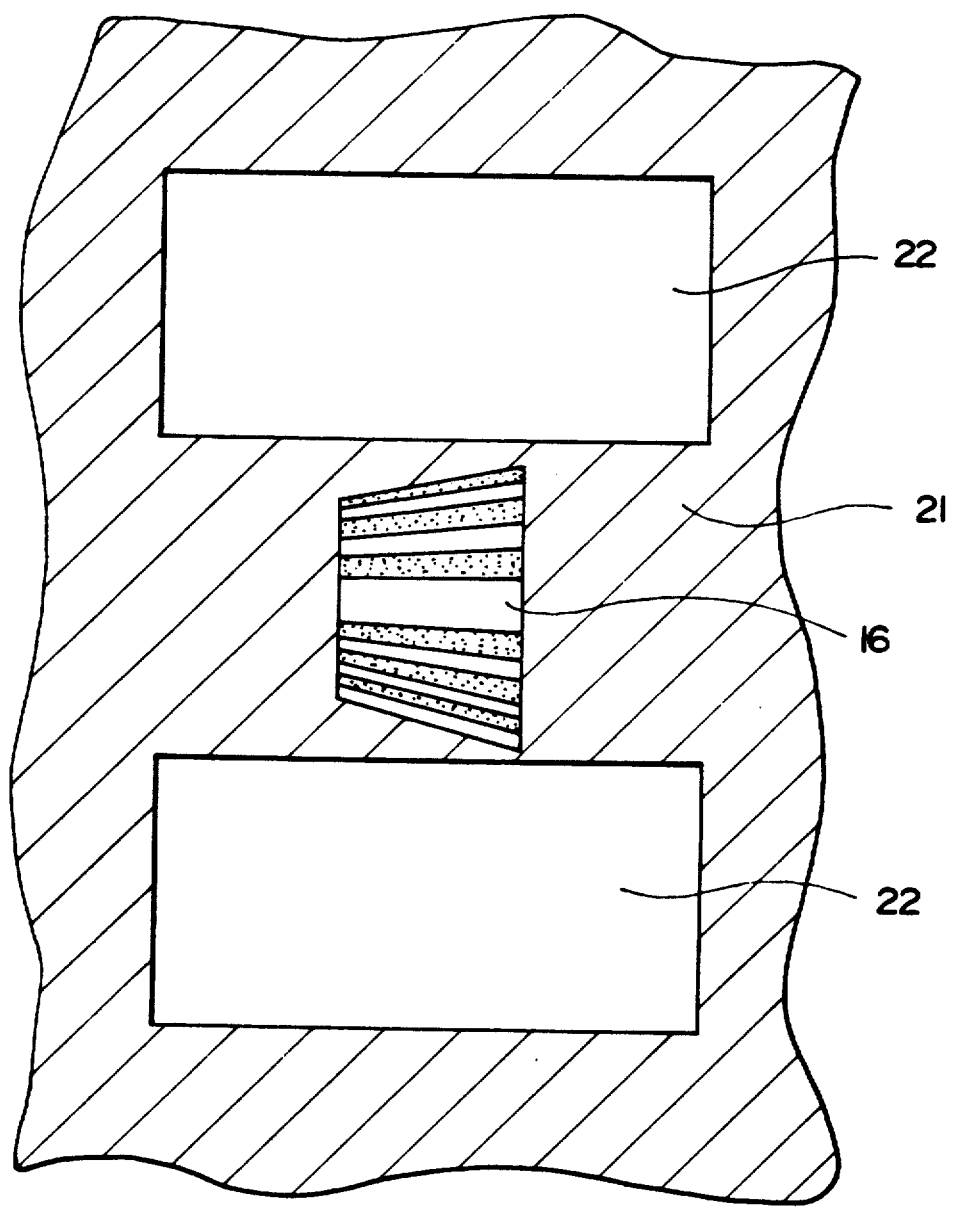
FIG. 19 is an explanatory diagram of the arrangement of a mask window area.

In FIG. 4, a window 22 through which a ray illuminates the alignment mark 17 of the wafer and a ray diffracted thereby pass is as shown in FIG. 19. The window 22 is provided on both sides of the mask mark 16.

According to the recent trend of an X ray mask, the transparent window section is made of SiN (thickness of 1 to 2 μm) and the opaque section is made of Ta (thickness of about 0.8 μm).

The window has advantages of largely reducing multiplex interference which is caused on the surface of the mark and wafer and a change of light intensity resulting from focusing spots caused by variation in a gap between the mask and wafer, so that stable spots having a high peak value and good symmetry can be obtained without being affected by variation in the gap. In addition, it makes it possible to construct the mask SFZP such that a light intensity of spots is not influenced by variation in a gap between the mask and wafer by preventing a Fresnel diffraction phenomenon of transmitting rays occurring on the mask SFZP.

Figure 20:
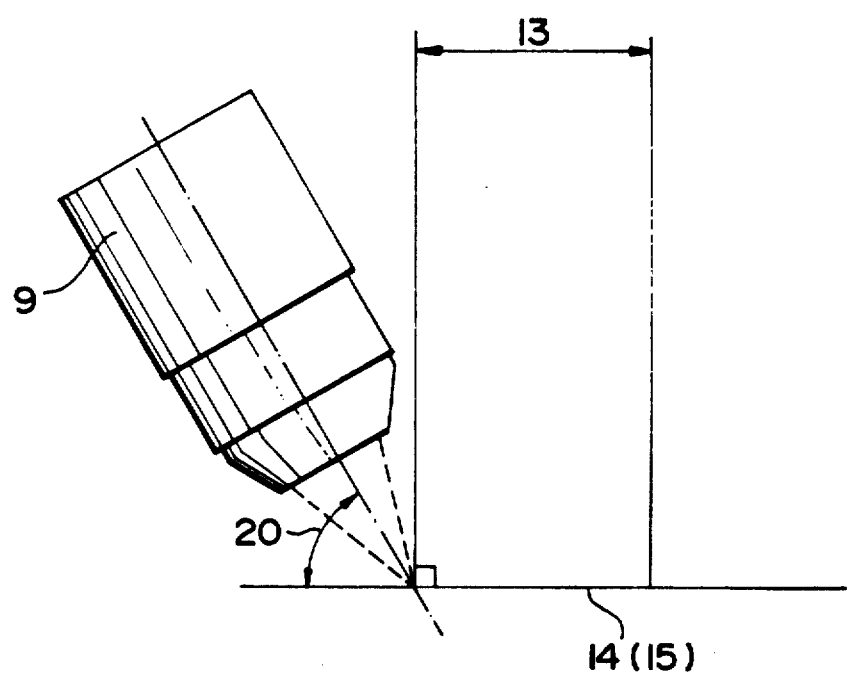
FIG. 20 is a front view of the arrangement of a detection optical system.

The arrangement of the detection optical system will be described in the following. In the present invention, since SFZPs are employed, an objective lens in the detection optical system can be largely inclined so as to be disposed outside the X ray exposure zone, resulting in that the structure is simplified as shown in FIG. 20. Assuming that an objective lens on the market equivalent to a working length=20 mm and NA=0.35 is employed, the relative position between the objective lens 9 and the mask 14 is shown in FIG. 20. A detection angle is about 60° with respect to the surface of the mask 14.

The structure and operation of a second embodiment of a position detector employing SFZPs under illumination of monochromatic light according to the present invention will be described hereinafter with reference to FIG. 23 to FIG. 37. In the drawings, like numericals and symbols refer to like parts as shown in the first embodiment and their description will be omitted.

Figure 23:
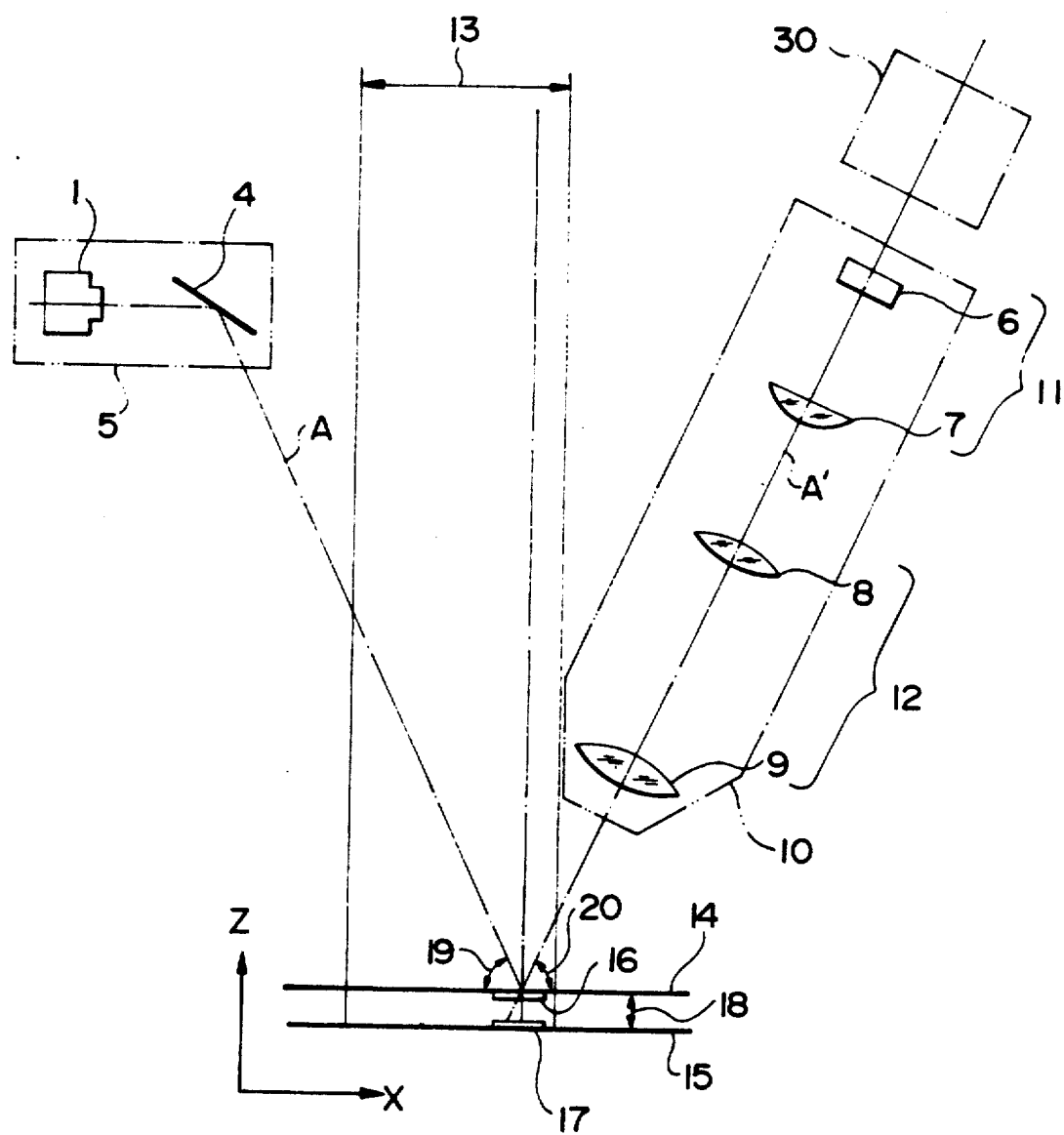
FIG. 23 is a schematic front view of a second embodiment of a position detector according to the present invention.
Figure 24:
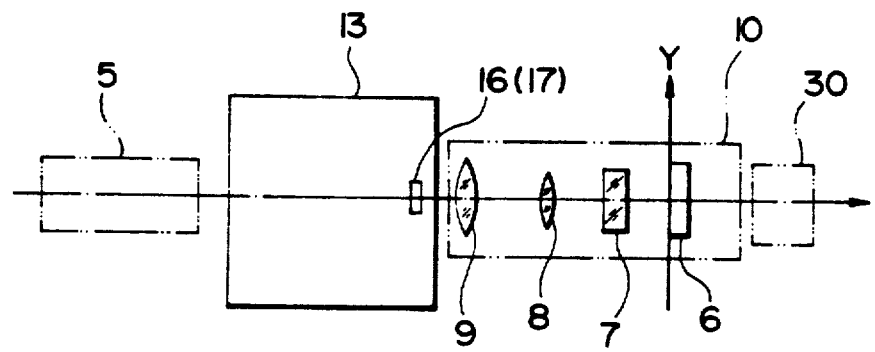
FIG. 24 is a schematic plan view of the position detector shown in FIG. 23, FIGS. 25 and 26 are diagrams for explaining Fresnel diffraction produced by alignment marks provided on SFZPs.

FIG. 23 is schematic front view of a position detector which is applied to a mask and wafer. FIG. 24 is schematic view of the position detector.

In the second embodiment of the position detector, like the first embodiment, an illumination optical system 5 and a detection optical system 10 are respectively arranged at the upper right and left of the surface of a mask and wafer which are superposed with a gap in opposing relationship with respect to the normal of the surface. An illumination incidence angle 19 and an optical detection angle 20 are equal, normally in a range of 45° to 80°. There are two points of difference between the first and second embodiments. The first is that the illumination optical system 5 employs a single wavelength ray in the illumination optical apparatus. A laser ray is employed as a light source for the single wavelength ray. However, any other illumination ray of a bright line with a reduced half width such as a laser ray of He-Ne of wavelength 633 nm. Ar of wavelength 488 nm and green He-Ne of wavelength 543.5 nm may be used if the ray is coherent. In the second embodiment, a laser ray of wavelength λ=633 nm from He-Ne laser source 1 is employed. The laser ray is reflected diagonally to the lower by a mirror 4 to a parallel ray for the illumination.

The second difference is that while the structure of the detection optical system 10 is similar to that of the first embodiment, a detection unit 12 is an ordinary magnifying optical system such as a microscope comprising an objective lens and a relay lens. As the objective lens, it is convenient to be an objective lens of apochromatic or achromatic system in which aberrations are properly corrected.

Alignment marks 16, 17 are provided on sector Fresnel zone plates (SFZP) 16, 17 of a mask 14 and wafer, respectively. The SFZP has its center line which its parallel in a direction X. The alignment marks 16, 17 are formed in a manner similar to those in the first embodiment shown in FIG. 4 and FIG. 5A.

The position detector of the second embodiment is constructed in a manner similar to the first embodiment in that principal focal planes of Fresnel diffraction images formed by the alignment marks 16, 17 to the monochromatic ray are superposed on respective focal planes of the objective lens 9 to the same ray and a linear sensor 6 which has an elongated detection zone in a direction Y is disposed, such that a superposed image on the focal plane of the objective lens is formed on the linear sensor 6 and a signal handling apparatus 30 is further provided such that a detected signal from the linear sensor 6 is handled to detect a relative position between the alignment marks 16, 17 in the direction Y.

The structural elements of the position detector of the second embodiment will be further described hereinafter in detail.

Figure 25:
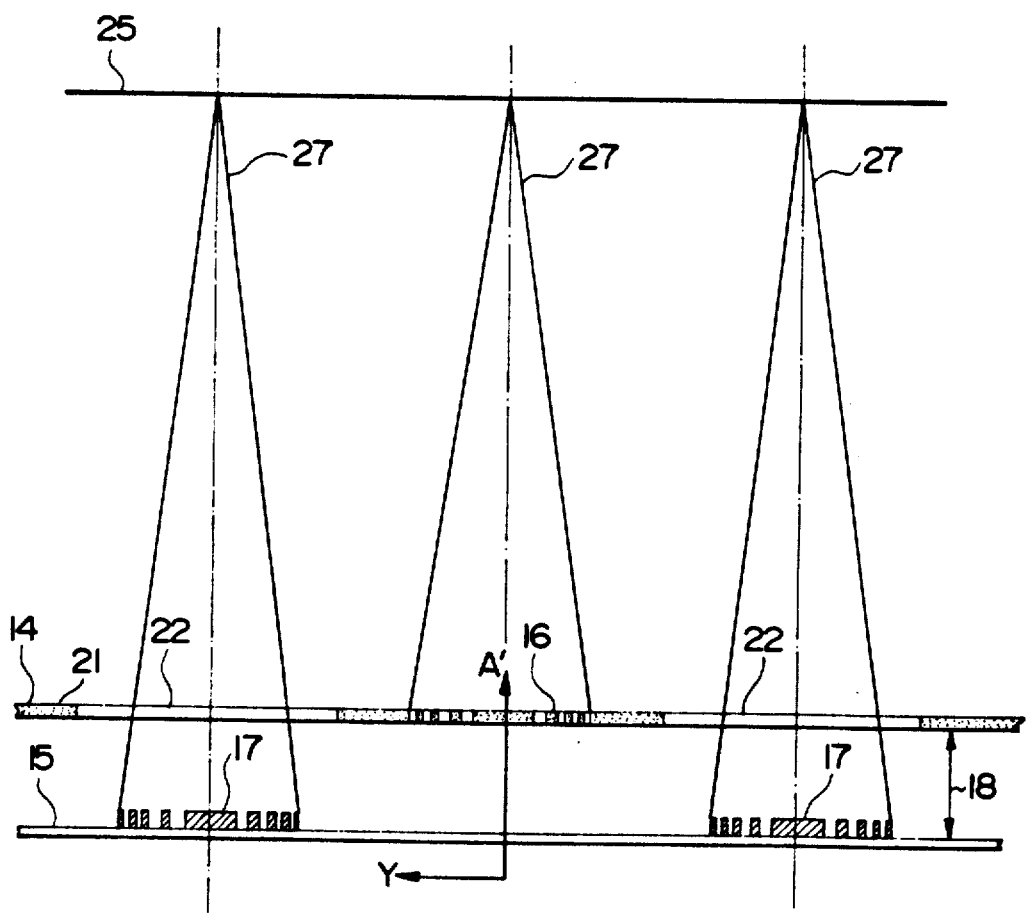
Figure 26:
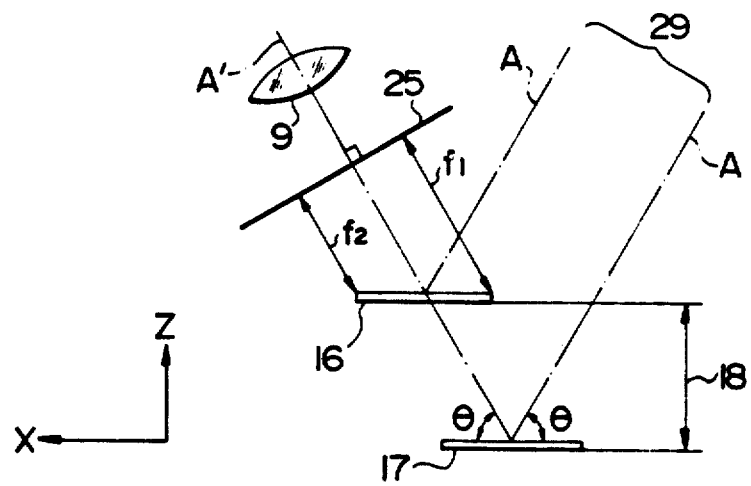
Figure 27:
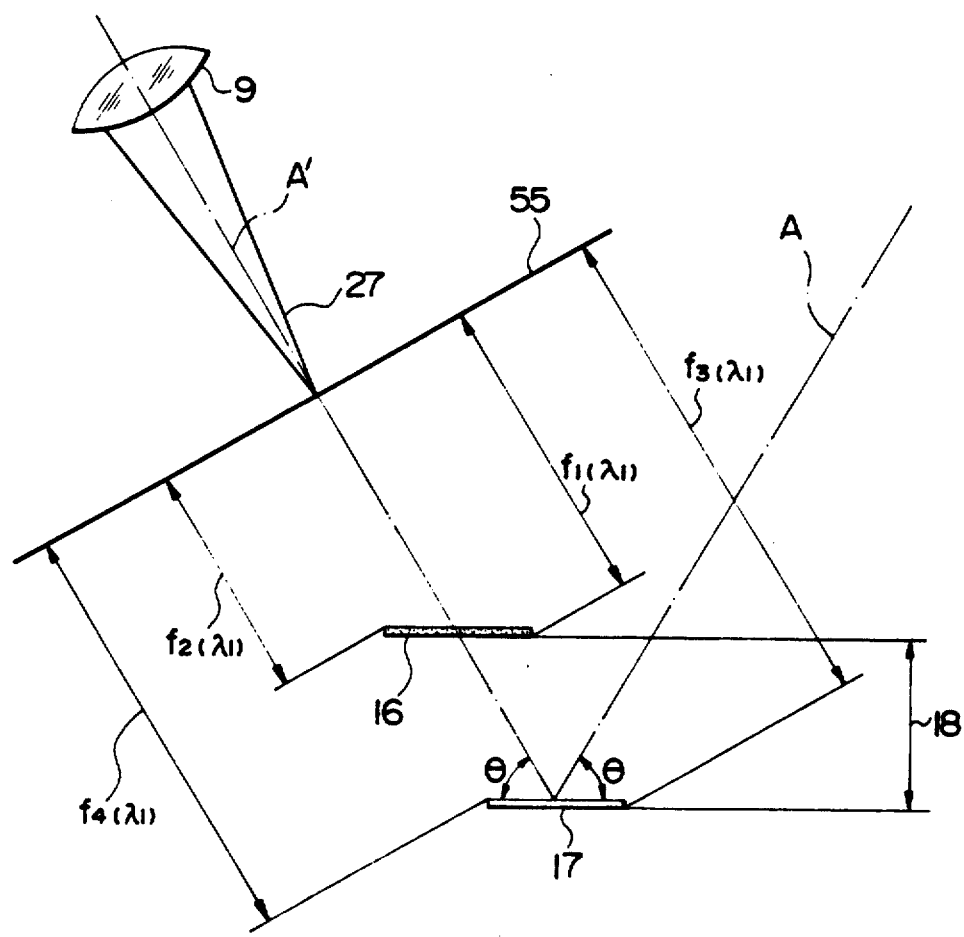
FIGS. 27, 28A and 28B are diagrams showing a relation between a Fresnel's diffraction image and a detection optical system.
Figure 28A:
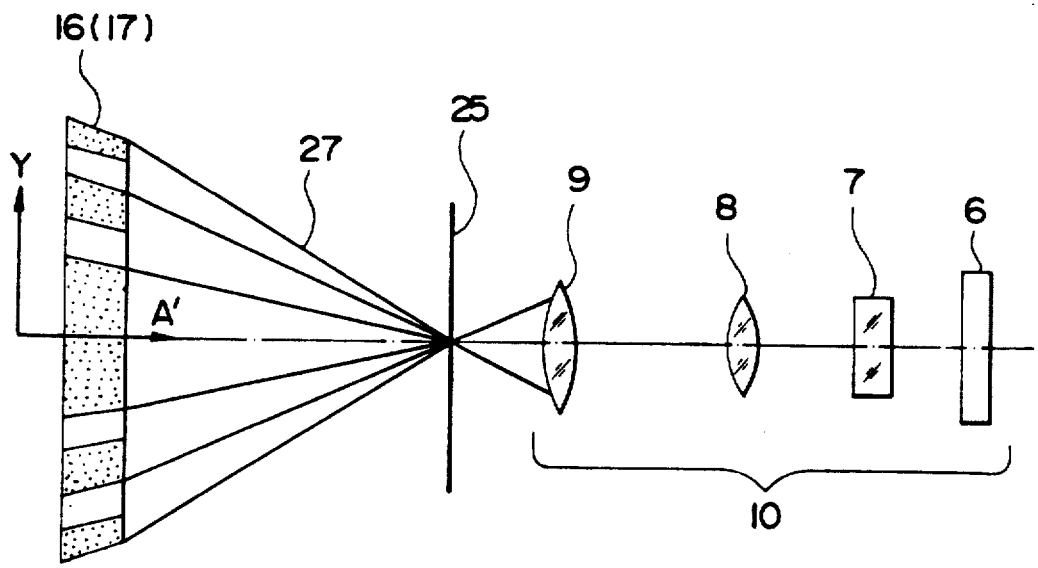
Figure 28B:
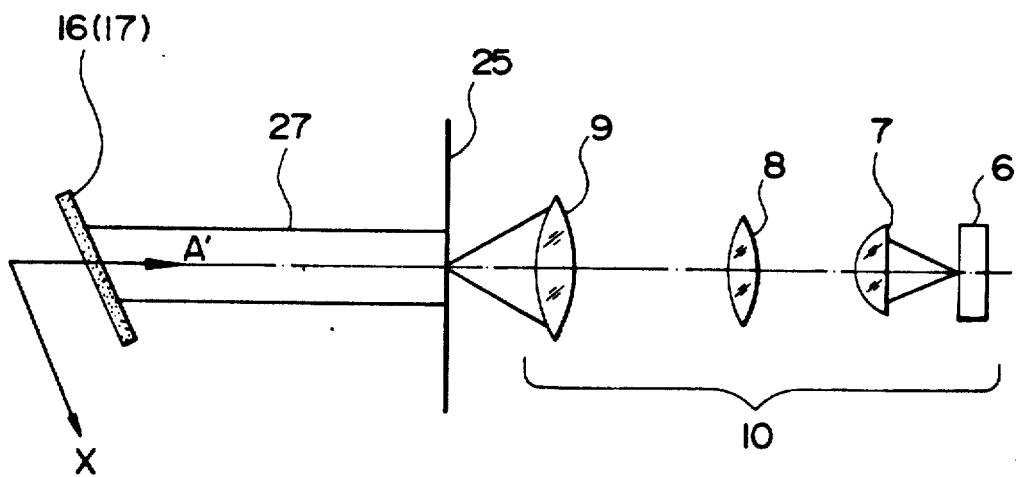

The mask 14 and wafer 15 on which the alignment marks 16, 17 are respectively provided, as shown in FIG. 25 and FIG. 26 on an enlarged scale, are superposed each other with a gap 18 (δ μm). When the mask and wafer are illuminated by a laser ray 1 from a light source 5, Fresnel diffraction is caused by the alignment marks 16, 17. The SFZPs 16, 17 are selected such that a difference between their respective principal focal lengths fm, fw on the axis A' of the detection optical system is equal to a gap in the direction A' (δ/sinθ μm), that is, fw−fm=δ/sinθ, so that the principal focal planes of Fresnel diffraction images of SFZPs 16, 17 are superposed each other to the same plane. In addition, the shapes of the SFZPs 16, 17 are designed such that the principal focal plane 25 of Fresnel diffraction image caused by the alignment marks 16, 17 on a plane X-Z (the image is in a straight line on the plane X-Z) is perpendicular to the optical axis A' of the detection optical systm, as shown in FIG. 26. The shapes of the SFZPs are designed based on the foregoing equation (1) and their stripe-patterns are expressed by the equations (2) and (3). In addition, an angle $\theta$ between the principal focal plane and the optical axis A' is expressed by the equation (4). The angle $\theta$ is equal to the detection angle 20 of the detection optical system 10 (FIG. 23). These are quite the same as those in the first embodiment. These positional relationships among the focal length of diffracted light by the alignment marks 16, 17 illumination optical axis A, detection optical axis A' and objective lens 9 are shown in FIG. 27. In addition, the relationship between the principal focal plane of Fresnel diffraction image and its detection system 10 is shown in FIG. 28A and 28B. A cylindrical lens 7 is provided in the detection optical system 10 to compress the Fresnel diffraction images of the alignment marks 16, 17 in a straight line extending perpendicularly to the optical axis A' on the principal focal plane in the direction of the image, in the same manner as the first embodiment as shown in FIG. 13. However, the provision of the cylindrical lens 7 is not necessarily required in the present invention. The reason is that when a line sensor to receive a Fresnel diffraction image is selected bo be sufficiently large in width in a direction perpendicular to the longitudinal direction thereof, it is possible to electrically compress the image on the line sensor, in place of an optical raster compression with a cylindrical lens.

A signal given by a linear sensor 6 is handled by a signal handling apparatus 30 (FIGS. 23 and 24) to detect a position. The signal apparatus 30 employs a similar pattern matching method in a manner similar to the first embodiment. Namely, as shown in FIG. 29A, three marks of the same configuration are arranged at a given interval. These marks are scanned in the direction of the interval to obtain an input picture image signal V(j), which is then differentiated to obtain an edge producing signal V'(j) as shown in FIG. 29B and an autocorrelation function A(W,P) defined by the following equation (23).

$$A(W,P) = \sum_{j=1}^{R} V'(P + j) \times V'(P + W + j) \quad (23)$$

where
P: Initial point of a correlated section,
R: Correlated section,
W: Width between right and left pattern,
V'(j): First order differentiated value of an input picture image value V(j) at a picture element j.

Intervals $W_1$ and $W_2$ between marks in FIG. 29A are found by A(W,P). A signal from the linear sensor 6 is as shown in FIG. 16A. The output signal is converted by an A/D converter into a digital value and differentiated in a first order to obtain a signal as shown in FIG. 16B. As such, a signal obtained by the detection optical system is handled to detect a position in much the same way as in the first embodiment.

As described above, in the present invention, Fresnel diffraction images caused by SFZPs on the principal focal plane thereof are focused by an objective lens, and a difference between the images is magnified by a magnification N to form an image on a linear sensor which is scanned in a direction Y. As shown in FIG. 18, a difference between foci of alignment marks 16, 17 on the linear sensor 6 is magnified to ($\Delta \delta \times N$) $\mu$m. The difference signal is handled to detect a relative position between the alignment marks 16, 17.

The rough specifications of an alignment apparatus utilizing the position detector of the present invention (FIG. 23) are substantially the same as those of the first embodiment. An example of practical design and stripe band ratio of the SFZP for use in the second embodiment are quite the same as those in the first embodiment. In addition, a transparent window is provided on the mask in the second embodiment, the structure of which is quite the same as that of the first embodiment.

With such arrangement, an objective lens in the detection optical system can be disposed so as to be largely inclined outside an X ray exposure zone. Furthermore, the objective lens is not required to consider design on its chromatic aberration, so that design and manufacture of the objective lens are extremely easy as compared with that in the first embodiment.

Outlines of the results of an experiment on the second embodiment of the present invention with the above design data will be described with reference to FIG. 30 to 37.

The object of this experiment is to confirm an accuracy of detecting a relative position between an X ray mask and a wafer coated with a resist in a position detector employing SFZPs made as a trial.

Figure 30:
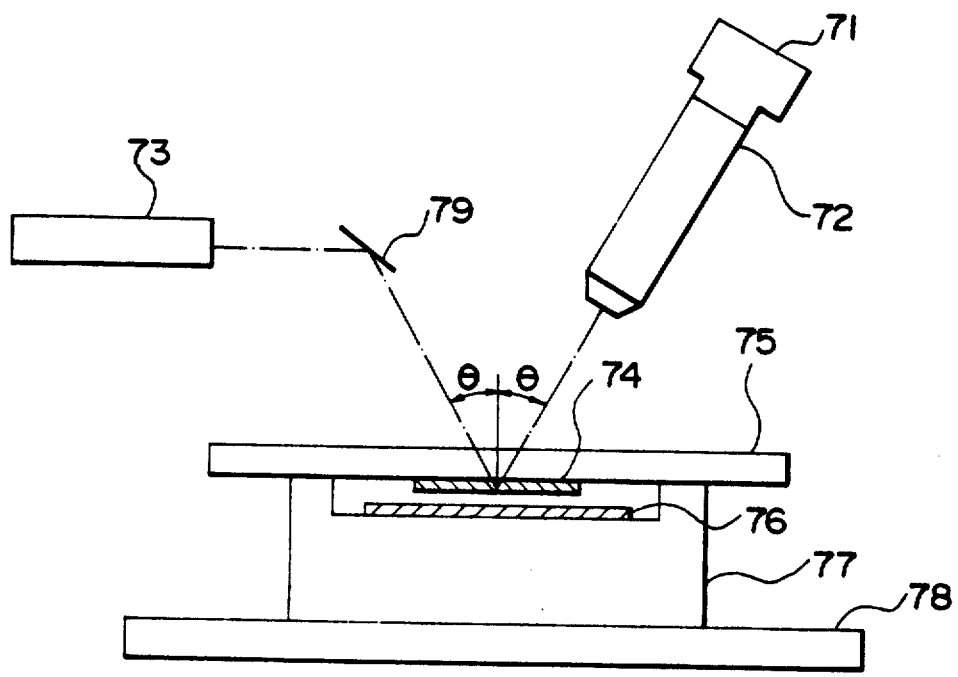
FIG. 30 is a front view showing a structure of an experimental apparatus for confirming accuracy of detection according to the present invention.

FIG. 30 is a schematic diagram of an apparatus used for the experiment. An X ray mask 74 and a wafer 76 coated with a resist are mounted with a gap of 40 $\mu$m therebetween on a slightly movable stage 75 and a wafer stage 77 on a shock preventing stand 78, respectively. A relative position between the mask 74 and the wafer 76 is detected by employing SFZPs when the mask 74 moves with a pitch of 0.01 $\mu$m.

An illumination system 73 illuminates the mask 74 and wafer 76 through a reflecting mirror 79 with light from He-Ne laser source ($\lambda = 633$ nm) at an incident angle $\theta = 30°$. A detector 72 and a TV camera which are disposed at an angle $\theta = 30°$ of the detection optical axis, detect a relative position. The detector 72 is an ordinary vertical incidence and reflection type microscope and has an objective lens of a numerical aperture NA = 0.3 and a detection magnification of 83.

Figure 31:
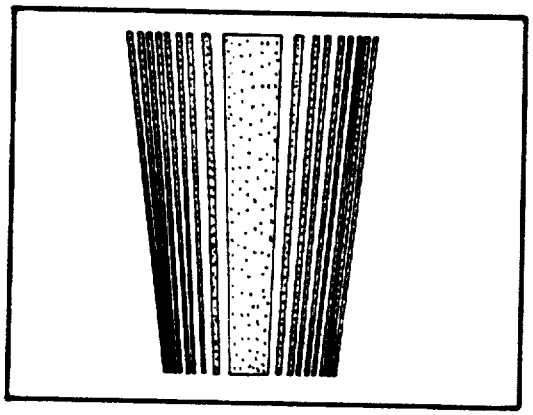
FIGS. 31 and 32 are enlarged diagrams of SFZP for use in the apparatus shown in FIG. 30 and on the basis of pictures taken by transmitting and reflecting light, respectively.
Figure 32:
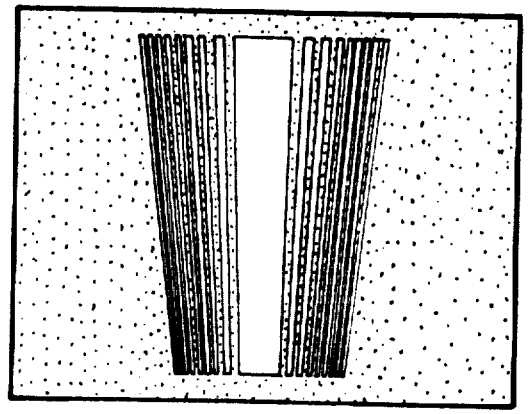

FIGS. 31 and 32 are diagrams based on micro photographs of the SFZP formed on the mask 74. FIG. 31 shows a photograph with transmitting light and FIG. 32 shows a photograph with reflected light (both have a magnification of 1000). Pattern of these SFZPs are formed of a tantalum Ta film with a thickness of 0.75±0.05 $\mu$m. Membranes are formed of SiN with a thickness of 2.0±0.2 $\mu$m.

The stage 75 is a mask stage on which the mask 74 is attracted and which is slightly movable less than 0.01 $\mu$m. The stage 75 is of a hinge structure of a single axis. A piezo element is used for an actuator and an electrostatic capacity sensor is used for positional detection in the stage 75.

Figure 33:
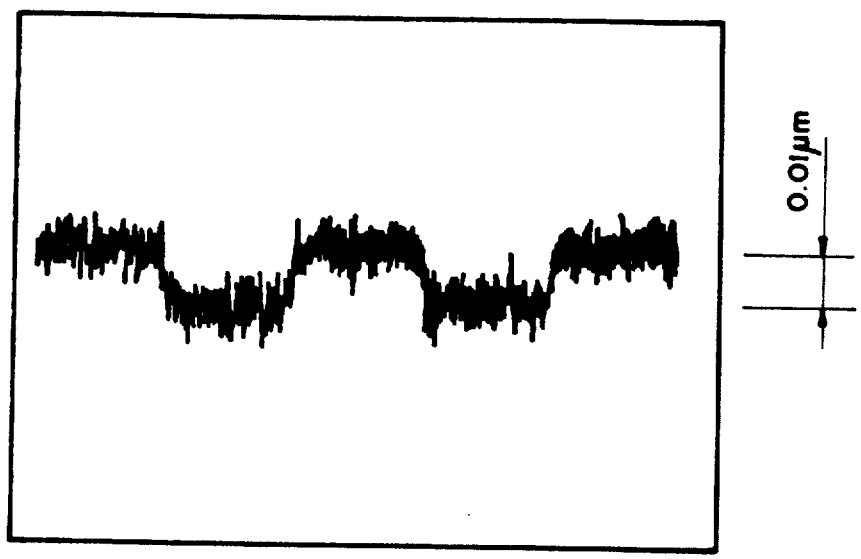
FIG. 33 is a diagram showing an output waveform of an electrostatic capacitance sensor during drive in step of 0.01 $\mu$m.

FIG. 33 showns output waves of the electrostatic capacity sensor when the stage 75 is driven in step of 0.01 $\mu$m. It will be seen from FIG. 33 that a drive of the stage 75 in step of 0.01 $\mu$m is performed with certainly.

The wafer stage 77 is a three-dimensional stage of X-Y-$\theta$ including a wafer chuck and a leveling mechanism and is attracted to the stage 75 in a vacuum during the detection of a relative position between the mask 74 and the wafer 76.

Figure 34:
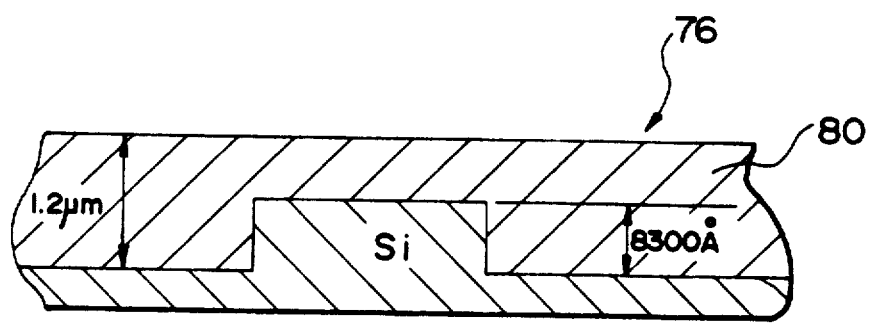
FIG. 34 is a section view of a wafer for use in the experiment.

FIG. 34 is a sectional view of a wafer 76. An SFZP on the wafer 76 is formed by a WELL pattern which is formed by Si etching operation. In addition, a resist 80 (PF6200) of 1.2 μm thick is applied on the pattern.

The results of experiment with the above arrangement will be described in the following.

Figure 35:
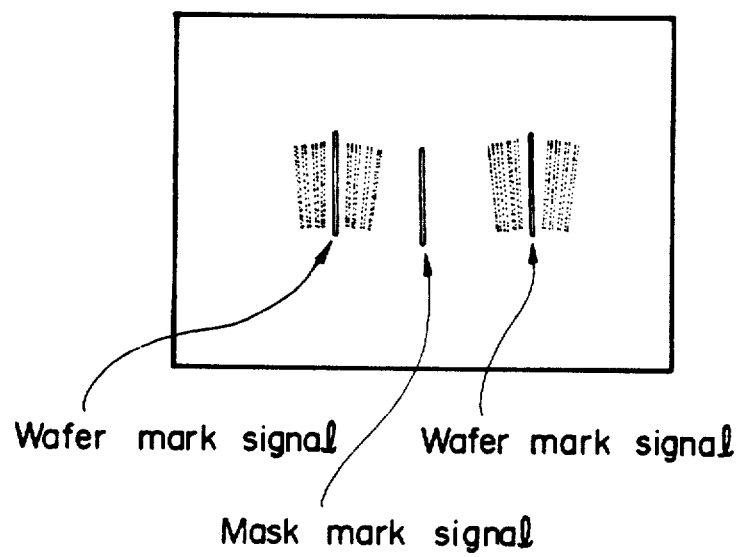
FIG. 35 is a diagram based on a picture of Fresnel diffraction images produced by an X ray mask and a wafer.

FIG. 35 is a diagram based on the picture, which is taken on a monitor, of Fresnel diffraction image from the SFZPs on the mask 74 and the wafer 76. It is possible to confirm from FIG. 35 that a good Frensnel diffraction image is formed by the SFZPs in accordance with the theory.

Figure 36:
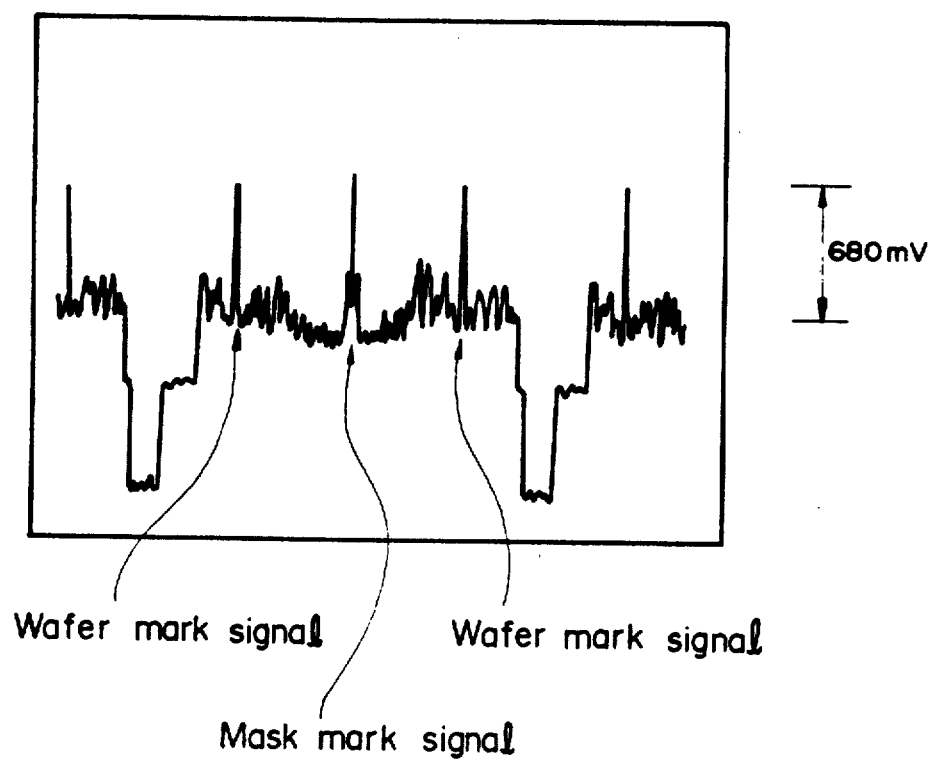
FIG. 36 is a diagram showing a waveform of a video signal.

FIG. 36 shows waveforms of video signals. The center waveform is a Fresnel diffraction image from the SFZP on the X ray mask 74 and waveforms on both sides of the center waveform are Fresnel diffraction images from the SFZP on the wafer 76. An intensity of the image signal is about 670 mV and a signal-to-noise ration (per scanning line) is $$S/N = 20 \log 670/110 \simeq 16 dB.$$

It is thus confirmed that a sufficient signal intensity is obtainable. The S/N ratio is here defined by the following.

$$S/N = 20 \log A/B$$

where A represents an alignment signal intensity (mV) and B represents a noise signal intensity B(mV).

Figure 37:
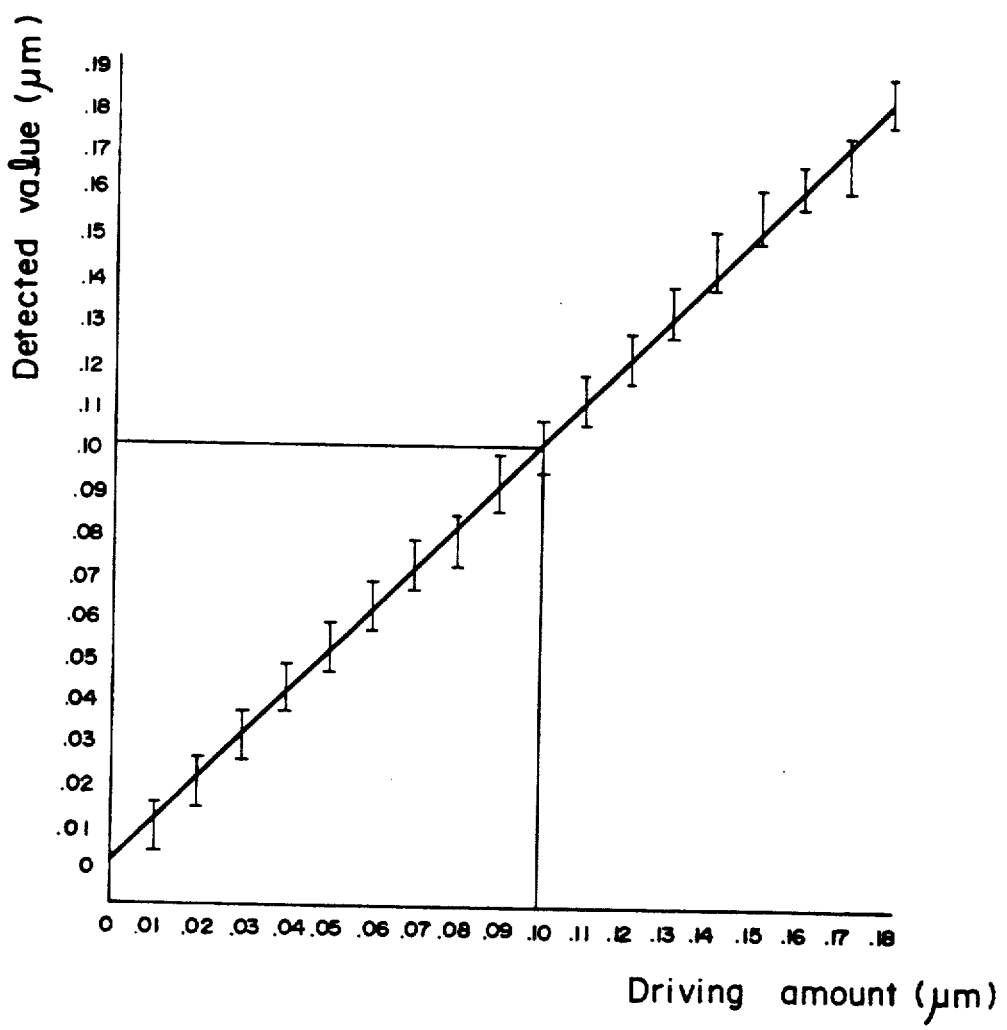
FIG. 37 is a graph showing an accuracy of detection.

An accuracy of detection is shown in FIG. 37. Ordinate denotes a detected position value (μm) and abscissa denotes a slightly moving amount (μm).

While the slightly movable stage 75 is driven to 0.18 μm in a pitch of 0.01 μm, a relative position between the mask 74 and the wafer 76 is detected. The number of detections in each step is 45 and accuracy in detection is evaluated with deviation of 3δ of a mean value.

Accuracy of detection is as follows.

① Linearity ≦ 0.004 μm
② 3δ ≦ 0.006 μm
③ Inclination = 45.32' (Scaling error ≦ 0.7%).

The linearity indicates a distance in a mean value to a straight line obtained by the method of least squares. The value 3δ indicates a deviation of detected values in the number of 45 times. The inclination indicates a tilt of the straight line, which is ideally 45°. The inclination appears in a scaling error which is 0.7% in FIG. 37.

According to the studies of the above results, it is clear that the detection apparatus employing a double focus optical apparatus under illumination of a plurality of wavelength rays, which method has been hitherto considered, is not required as long as accuracy in order of 0.01 μm in positional detection is demanded. As compared with the detection apparatus of the first embodiment, however, the second embodiment employing illumination of a monochromatic ray has a tendency that dependence on process is increased and especially influence of multiplex interferences occuring in a resist film depends largely upon unevenness in thickness and density of the resist film and difference in thickness of marks.

Consequently, while an essential solution for a position detector of the kind contemplated by the invention is with an apparatus of employing double focus detection under illumination of a plurality of waveform rays according to the foregoing first embodiment, the apparatus employing illumination of a single waveform ray according to the second embodiment may be sufficient for use in the case where detection in order of 0.01 μm is demanded because various improvement in process have been made.

While the foregoing is the case where a position detector according to the present invention is applied to a stepper exposure apparatus, it should be understood that the position detector is applicable to other apparatus of the same kind.

What is claimed is:

1. A position detector for use in an X ray exposure apparatus for detecting a relative position between first and second object bodies having respective planar surfaces which are substantially parallel to each other and which are minutely spaced in the direction of a normal to the surfaces of said bodies, the relative position being in the direction perpendicular to said normal; comprising:

first and second sector Fresnel zone plates (SFZP) on which respective alignment marks are formed and which are disposed respectively on said first and second object bodies;

illuminating means provided on one side of said normal and at an angle with respect thereto for illuminating said first and second SFZPs with a ray of light of a single wavelength;

detection means including an objective lens disposed on the opposite side of said normal at the same angle with respect thereto as said illuminating means for detecting Fresnel diffraction images formed by said alignment marks to said single wavelength ray; said first and second SFZPs being constructed such that a principal focal plane of a Fresnel diffraction image caused by said first SFZP to said single wavelength rays agrees with a principal focal plane of a Fresnel diffraction image caused by said second SFZP to said single wavelength ray and said principal focal planes in agreement with each other agrees with a focal plane of said detection means;

transducer means disposed on an image forming plane of said detection means for converting a Fresnel diffraction image formed in a straight line by said first and second SFZPs into an electrical signal by linearly scanning said Fresnel diffraction image in the direction perpendicular to the image; and signal handling means for handling said electrical signal obtained by said transducer means to detect a relative position between said alignment marks in the direction perpendicular to said normal.

2. A position detector according to claim 1 in which said first object body is a mask and said second object body is a wafer.

3. A position detector according to claim 1 in which said first SFZP is disposed between a pair of said second SFZPs.

4. A position detector according to claim 1 in which said second SFZP is disposed between a pair of said first SFZPs.

5. A position detector according to claim 1 in which said first SFZP is disposed over said second SFZP.

6. A position detector according to claim 1 in which said first SFZP is provided with a transparent window zone through which said ray of light from said illuminating means passes and is incident upon said second SFZP and is diffracted therefrom, said diffracted ray passing through said window to said detection means.

7. A position detector according to claim 1 in which said ray of a single wavelength is coherent ray of bright line with a reduced half width selected from the group consisting of a laser ray of He-Ne of a wavelength of 633 nm, a laser ray of Ar of a wavelength of 488 nm and a laser ray of green He-Ne of a wavelength of 543.5 nm.

8. A position detector according to claim 1 in which said illumination means and detection means are arranged such that an illumination optical axis angle of said illumination means whose optical axis makes with the surface of the alignment mark is equal to a detection optical axis angle of said detection means whose optical axis makes with the surface of the alignment mark at the opposite sides of the normal of the surface.

9. A position detector according to claim 8 in which said illumination angle is in a range of 45° to 80°.

10. A position detector according to claim 1 in which said detection means is a general magnifying optical system comprising an objective lens and a relay lens.

11. A position detector according to claim 10 in which said objective lens is one of an apochromatic or a chromatic system in which an aberration is properly compensated.

12. A position detector according to claim 1 in which said transducer means is a one dimensional solid-state CCD camera.

13. A position detector according to claim 1 in which said signal handling means employs a similar pattern matching method.

14. A position detector for use in an X ray exposure apparatus for detecting a relative position between first and second object bodies having respective planar surfaces which are substantially parallel to each other and which are minutely spaced in the direction of a normal to the surfaces of said bodies, the relative position being in the direction perpendicular to said normal; comprising:

first and second Fresnel's zone plate (SFZP) on which respective alignment marks are formed and which are disposed respectively on said first and second object bodies;

illumination means disposed on one side of said normal and at an angle with respect thereto for simultaneously illuminating said first and second SFZPs with rays of a plurality of wavelengths from the same direction; said first and second SFZPs being constructed such that a principal focal plane formed by Fresnel diffraction from said first SFZP, which plane lies at a different position to each of said rays of said plurality of wavelengths, agrees with a principal focal plane formed by Fresnel diffraction from said second SFZP, which plane lies at a different position to each of said rays of said plurality of wavelengths, with respect to a ray of at least one of said plurality of wavelengths;

detection means disposed on the opposite side of said normal at the same angle with respect thereto as said illuminating means and including an objective lens having such an axial chromatic aberration that its focal planes to said rays of said plurality of wavelengths agree with respective principal focal planes formed by Fresnel diffraction from said second SFZP, which planes lie at different positions to said rays of plurality of wavelengths, for detecting Fresnel diffraction images formed by said alignment marks to said rays of said plurality of wavelengths;

transducer means disposed on an image forming plane of said detection means for converting a Fresnel diffraction image in a straight line formed by said first and second SFZPs into an electrical signal by linearly scanning said Fresnel diffraction image in the direction perpendicular to the image; and signal handling means for handling said electrical signal obtained by said transducer means to detect a relative position between said alignment marks in the direction perpendicular to said normal.

15. A position detector according to claim 14 in which said first object body is a mask and said second object body is a wafer.

16. A position detector according to claim 14 in which said first SFZP is disposed between a pair of said second SFZPs.

17. A position detector according to claim 14 in which said second SFZP is disposed between a pair of said first SFZPs.

18. A position detector according to claim 14 in which said first SFZP is disposed over said second SFZP.

19. A position detector according to claim 14 in which said first SFZP is provided with a transparent window zone through which said ray from said illuminating means passes and is incident upon second SFZP and is diffracted therefrom, said diffracted ray passing through said window to said detection means.

20. A position detector according to claim 14 in which said illumination means employs a coherent laser ray of bright line with a reduced half width.

21. A position detector according to claim 14 in which said illumination means and detection means are arranged such that an illumination optical axis angle of said illumination means whose optical axis makes with the surface of the alignment mark is equal to a detection optical axis angle of said detection means whose optical axis makes with the surface of the alignment mark at the opposite sides of the normal of the surface.

22. A position detector according to claim 19 in which said illumination angle is in a range of 45° to 80°.

23. A position detector according to claim 14 in which said detection means comprises an objective lens having an axial chromatic aberration and relay lens.

24. A position detector according to claim 14 in which said transducer means is a one dimensional solid-stage CCD camera and a MOS type LSI.

25. A position detector according to claim 14 in which said signal handling means employs a similar pattern matching method.

* * * * *